(12) United States Patent
Shi et al.

(10) Patent No.: US 7,135,243 B2
(45) Date of Patent: Nov. 14, 2006

(54) ORGANIC ELECTROLUMINESCENT DEVICES

(75) Inventors: Jianmin Shi, Rockville, MD (US); Eric Forsythe, Silver Spring, MD (US); David Claude Morton, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/807,099

(22) Filed: Mar. 23, 2004

(65) Prior Publication Data
US 2005/0214566 A1    Sep. 29, 2005

(51) Int. Cl.
*H01L 51/50* (2006.01)

(52) U.S. Cl. ............... 428/690; 428/917; 313/504; 313/506

(58) Field of Classification Search ............ 428/690, 428/917; 313/504, 506
See application file for complete search history.

(56) References Cited

U.S. PATENT DOCUMENTS

2004/0076853 A1* 4/2004 Jarikov ............ 428/690
2005/0048313 A1* 3/2005 Sotoyama ............ 428/690

FOREIGN PATENT DOCUMENTS

EP        1359790 A2 *  11/2003
JP        08-199162 A *   8/1996

* cited by examiner

*Primary Examiner*—Dawn Garrett
(74) *Attorney, Agent, or Firm*—A. David Spevack; Stephen M. BLoor

(57) ABSTRACT

An organic EL device, comprising an anode and a cathode, and at least one organic luminescent layer comprising a compound of the formula:

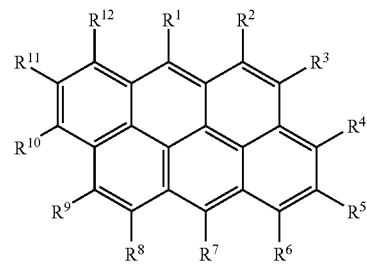

positioned between said anode and said cathode, and wherein:
$R^1$, $R^2$, $R^3$, $R^4$, $R^5$, $R^6$, $R^7$, $R^8$, $R^9$, $R^{10}$, $R^{11}$ and $R^{12}$ are individual substituents, each substituent is an individual group selected from the group consisting of hydrogen, halogens, and groups that contain 1 to 48 carbon atoms, and at least one group is not hydrogen.

11 Claims, 9 Drawing Sheets

Schematic diagrams of the multi-layer structures of preferred EL devices

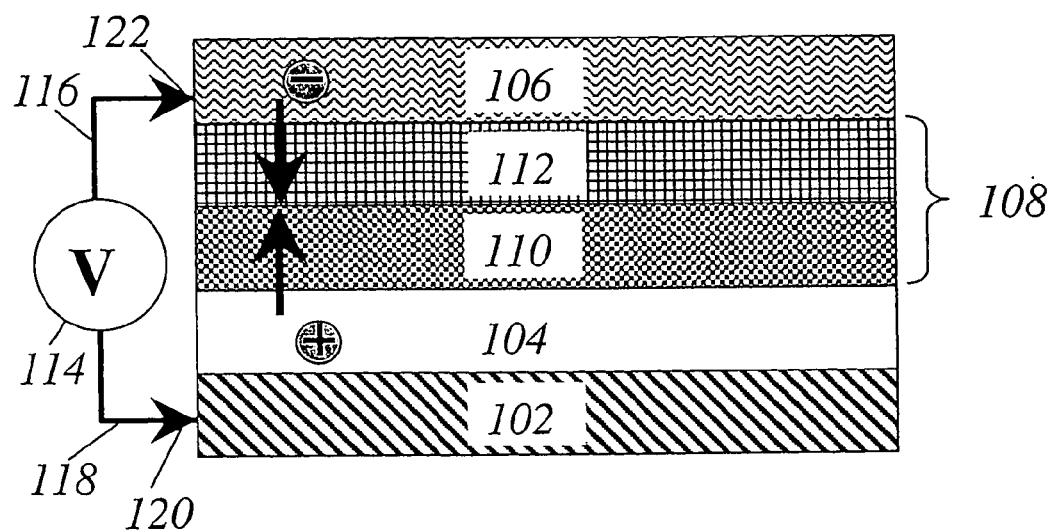
FIGS. 1. Schematic diagrams of the two-layer structures of preferred EL devices

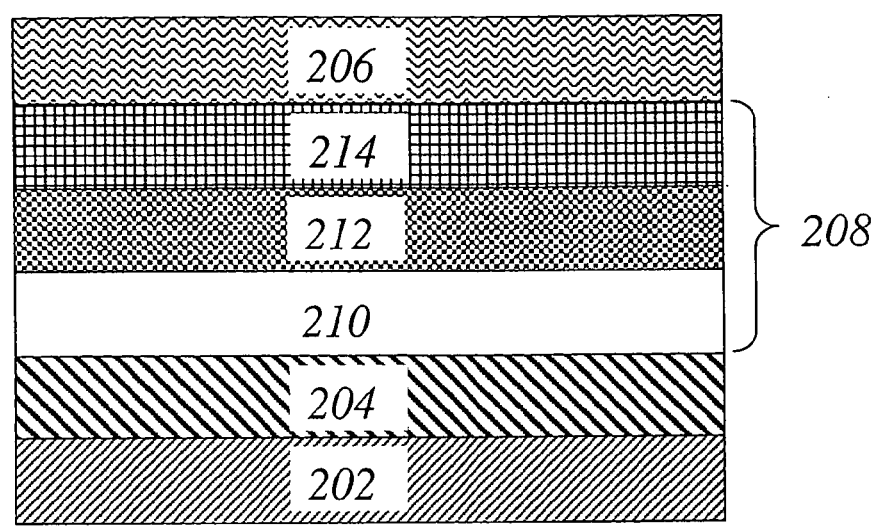
FIGS. 2. Schematic diagrams of the three-layer structures of preferred EL devices

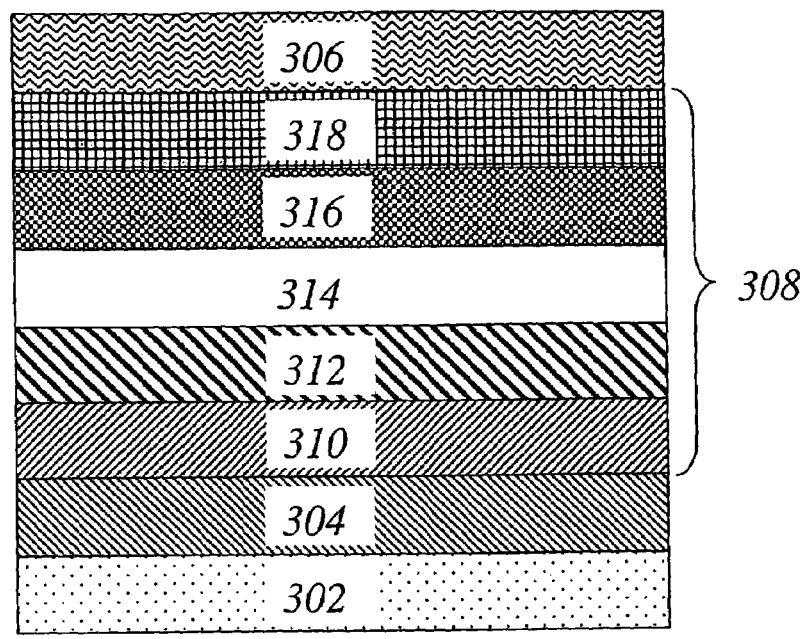
FIGS. 3. Schematic diagrams of the multi-layer structures of preferred EL devices

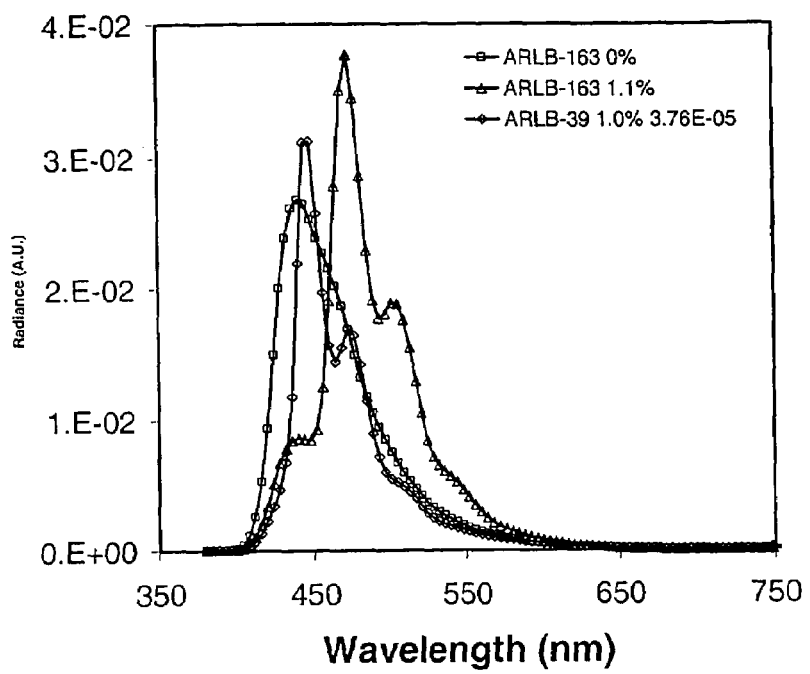
Fig. 4 EL spectra for undoped TBADN (Example 16) TBADN doped with ARL-39 (Example 17) at a concentration of 1.1%, and TBADN doped with ARL-163 (Example 18) at a concentration of 1.0%. The EL spectra were measured at a drive current density of 20mA/cm$^2$.

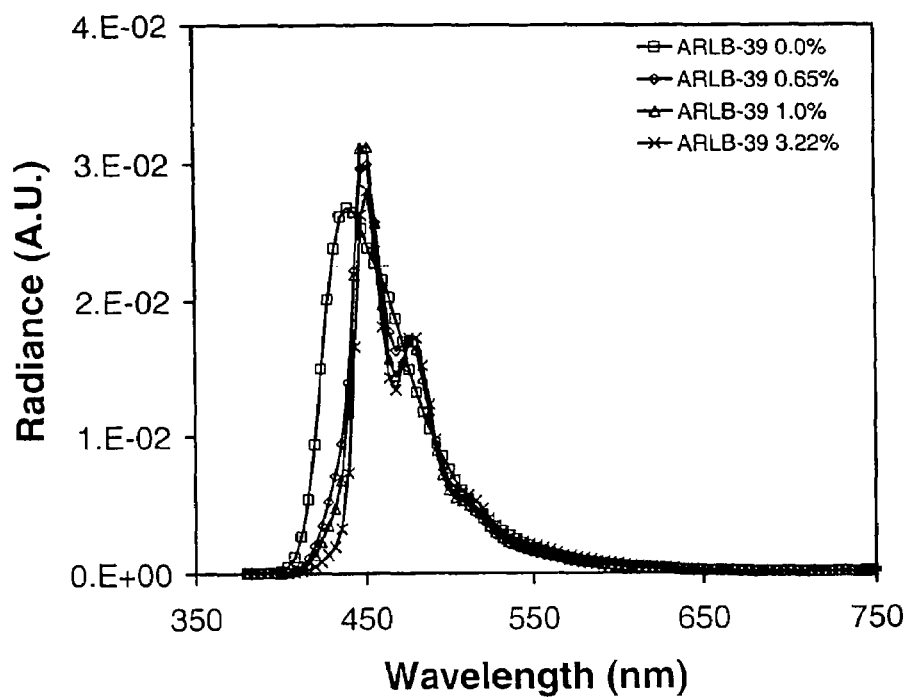
Fig. 5 Spectra for ARLB-39 as a function of doping concentration measured at a drive current density of 20 mA/cm$^2$

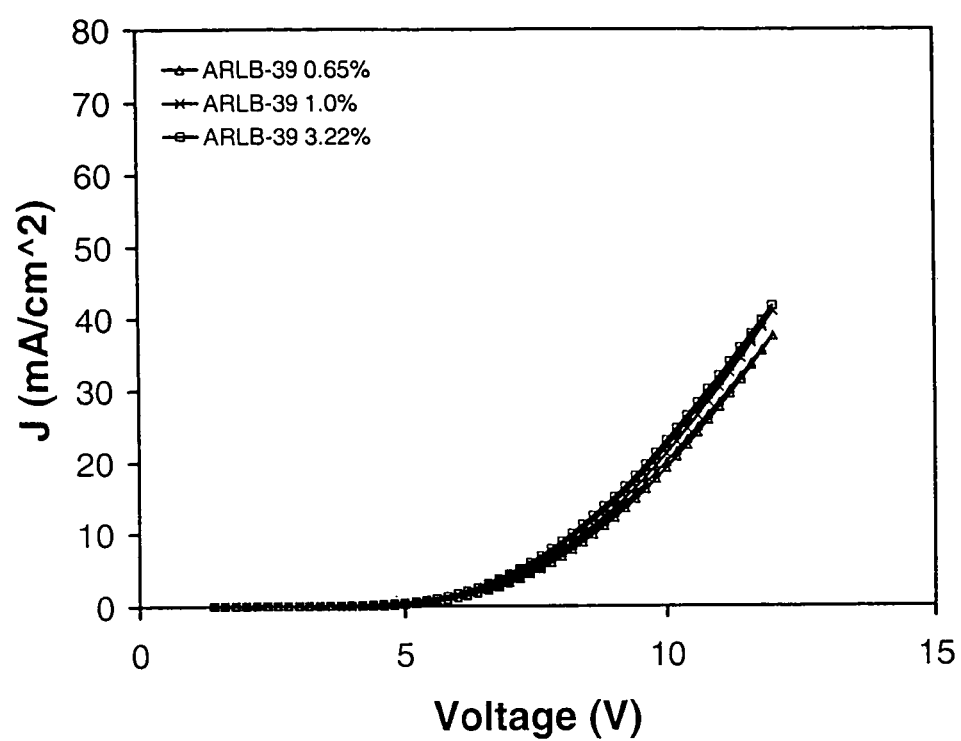
Fig. 6 illustrated the current density – voltage relation as a function of three doping concentration

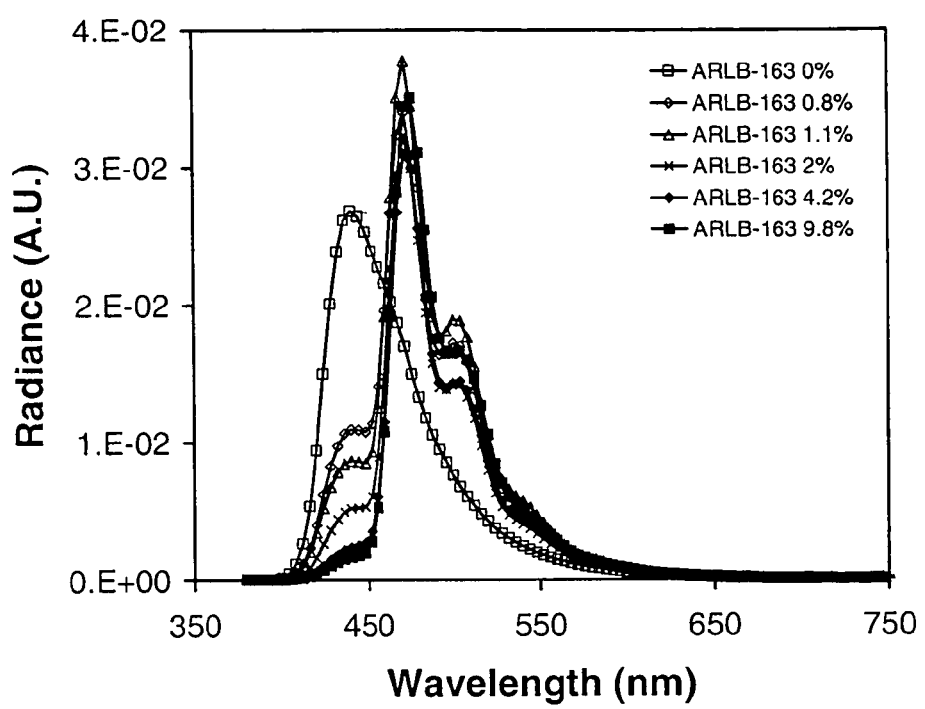
Fig. 7 Spectra for ARLB-39 as a function of doping concentration measured at a drive current density of 20 mA/cm$^2$

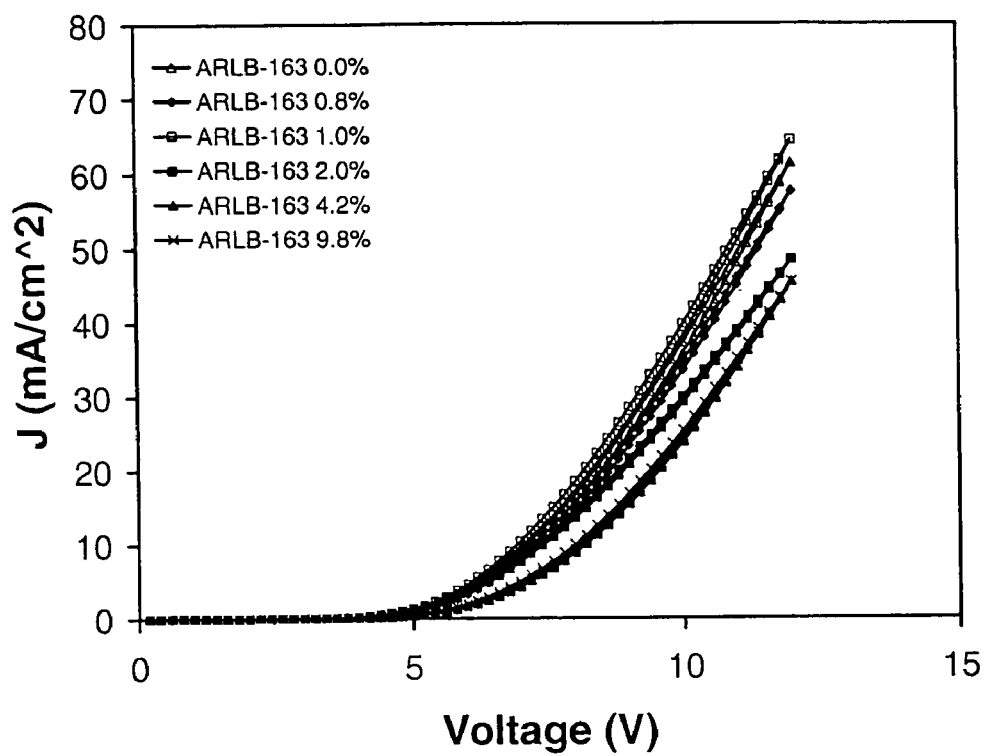
Fig. 8 illustrated the current density – voltage relation as a function of doping concentration.

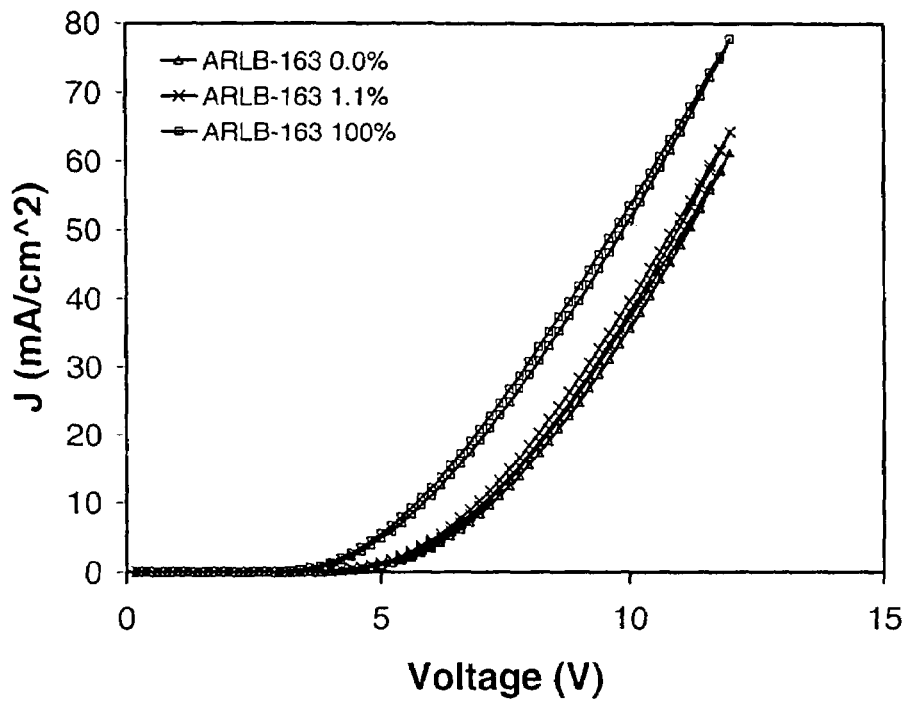
Fig. 9 illustrated the current density – voltage relation for undoped TBADN layer, TBADN doped with 1.1% (v/v) ARLB-163 and 1000 (Å) thick ARLB-163 with no doping

US 7,135,243 B2

ORGANIC ELECTROLUMINESCENT DEVICES

CROSS REFERENCE TO RELATED APPLICATION

Reference is made to commonly-assigned U.S. patent application filed concurrently herewith, entitled "Organic Luminescent Materials" by Shi et. al., patent application Ser. No. 10/807,130 filed Mar. 23, 2004 now U.S. patent application Publication No. 20050212409 Published Sept. 29, 2005, the teaching of which are incorporated herein.

FIELD OF THE INVENTION

This invention relates to organic electronic devices, more specifically related to an organic electroluminescent (EL) device contain a novel class of organic electroluminescent materials.

BACKGROUND OF THE INVENTION

Organic EL devices are know to be efficient and capable of producing a wide range of colors and are useful for many applications such as flat panel display.

Organic EL devices generally have a layered structure with an organic luminescent medium sandwiched between an anode and a cathode. The organic luminescent medium usually refers to an organic light emitting material or a mixture thereof in the form of a thin amorphous or polycrystalline film. Representatives of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. In these prior arts, the organic luminescent medium was formed of a conjugated organic host material and a conjugated organic activating agent having condensed benzene rings. Naphthalene, anthracene, phenanthrene, pyrene, benzopyrene, chrysene, picene, carbazole, fluorene, biphenyl, terpheyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic luminescent medium was present as a single layer having a thickness much above 1 micrometer. The voltage required to drive the EL devices was as much as a few hundreds volts, thus the luminous efficiency of these EL devices was rather low.

In U.S. Pat. No. 4,356,429, Tang further advanced the art of organic EL device by disclosing a bi-layer EL device configuration. The organic luminescent medium in this bi-layer configuration comprises of two extremely thin layers of organic film (<1.0 micrometer in combined thickness) sandwiched between the anode and cathode. The layer adjacent to the anode, termed the hole-transport layer, is specifically chosen to transport predominantly holes only in the EL device. Likewise, the layer adjacent to the cathode is specifically chosen to transport predominantly electrons only in the EL device. The interface or junction between the hole-transport layer and the electron-transport layer is referred to as the electron-hole recombination zone where the electron and hole recombine to produce electroluminescence with the least interference from the electrodes. This recombination zone can be extended beyond the interface region to include portions of the hole-transport layer or the electron-transport layer or both. The extremely thin organic luminescent medium offers reduced electrical resistance, permitting higher current densities for a given voltage applied on the EL device. Since the EL intensity is directly proportional to the current density through the EL device, this thin bi-layer construction of the organic luminescent medium allows the EL device to be operated with a voltage as low as a few volts, in contrast to the earlier EL devices. Thus, the bi-layer organic EL device has achieved a high luminous efficiency in terms of EL output per electrical power input and is therefore useful for applications such as flat-panel displays and lighting.

For the production of full-color EL display panel, it is necessary to have efficient red, green, and blue (RGB) EL materials with proper chromaticity and sufficient luminance efficiency. A doped EL system based on the principle of guest-host energy transfer to effect the spectral shift from tris-(8-hydroxyquinolinato)aluminum (Alq) to the dopant molecules has been disclosed by Tang et al in U.S. Pat. No. 4,769,292. The guest-host doped system offers a ready avenue for achieving such an objective, mainly because a single host with optimized transport and luminescent properties may be used together with various guest dopants leading to EL of desirable hue. It usually can be achieved by applying the three layer organic EL device that contains a light-emitting layer between the hole transport layer and electron transport layer that has been disclosed by Tang et al [J. Applied Physics, Vol. 65, Pages 3610–3616, 1989]. The light-emitting layer commonly consists of a host material doped with a guest material. The host materials in lightemitting layer can be electron transport materials, such as 8-hydroxyquinoline aluminum complex [U.S. Pat. No. 4,769,292], the hole transport materials, such as aryl amines [Y. Hamada, T. Sano, K. Shibata and K. Kuroki, Jpn. J. Appl. Phys. 34, 824, 1995], or the charge injection auxiliary materials, such as stilbene derivatives [C. Hosokawa et al., Appl. Phys. Lett., 67(25) 3853, 1995]. The doped guest materials, also known as the dopant, are usually chosen from highly fluorescent dyes. In the three layer organic EL device, the light-emitting layer provides an efficient site for the recombination of the injected hole-electron pair followed by the energy transfer to the guest material and produces the highly efficient electroluminescence.

Alq is only suitable host for green and red EL emitters since its emission at 530 nm is adequate to sensitize guest EL emission in the green and red spectral region. In general, the host material in the light emitting layer should be as luminescent as possible and also the luminance wavelengths are desired to be in the blue or near the UV region. The latter attribute is important for down-shifting of the EL emission wavelength in a host-guest emitter layer that is able to produce blue, green, red, and white light output.

Shi et. al. in U.S. Pat. Nos. 5,935,721 and 5,972,247 has disclosed organic electroluminescent (EL) element, that belongs to 9,10-di-(2-naphthyl)anthracene and 9,10-bis(3'5'-diaryl)phenyl anthracene derivatives derivatives, provides a thermally stable, glassy, and highly fluorescent materials in condensed thin film which dramatically exhibits different EL performance than that of 9,10-(diphenyl)anthracene derivatives. As a result, organic EL device employing these anthracene derivatives in light-emitting layer produce a bright blue emission and long operational stability. In accordance with the present invention, Shi et. al also taught that thiese anthracene derivatives are extremely useful for the production of full color EL display panel. With these anthracene derivatives as host materials, an appropriate EL hues or colors, including white, have also been produced by a downhill energy transfer process. For example, a green EL emission has been produced by doping into the anthracene derivatives with small amount of a green fluorescent sensitizing dye. This host-guest energy transfer scheme has been discussed in detail by Tang et al. in U.S. Pat. No. 4,769,292. A white EL emission has been produced by combination of two emissions. This scheme has been disclosed in detail by Shi et. al, U.S. Pat. No. 5,683,823.

In order to achieve the best performance of light output through the guest-host doped system, especially through the light emitting layer that consists of host and dopant materials. The dopant materials play an important role in term of enhance the light output efficiency, color purity and device operational stability. There are only a few of classes materials have been successfully used to produce blue emission. One of these is stilbene derivatives containing arylaminogroups. [C. Hosokawa et al., Appl. Phys. Lett., 67(25) 3853, 1995]. However, the liable arylamino-groups is not preferred in achieving desired device stability. Another is perylene and its derivatives used by Kodak. the small molecular size of perylene is not preferred in fabrication process. Modifying the perylene derivatives to increase the molecular size usually limited by spectrum shift away from pure blue emission.

SUMMARY OF THE INVENTION

It is an object of the present invention to provide an improved organic EL device.

This object is achieved by an organic EL device, comprising an anode and cathode, and at least one organic luminescent medium containing a luminescent compound of the formula I:

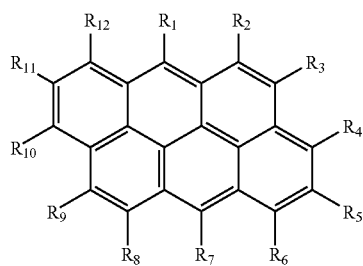

Formula I wherein:

$R^1$, $R^2$, $R^3$, $R^4$, $R^5$, $R^6$, $R^7$, $R^8$, $R^9$, $R^{10}$, $R^{11}$, and $R^{12}$ are individual substituents, each substituent is an individual group selected from the group consisting of hydrogen, halogens, and groups that contain 1 to 48 carbon atoms, and at least one group is not hydrogen.

Group 1: hydrogen, or alkyl of from 1 to 48 carbon atoms, and each $R^1$, $R^2$, $R^3$, $R^4$, $R^5$, $R^6$, $R^7$, $R^8$, $R^9$, $R^{10}$, $R^{11}$, and $R^{12}$ can connect with their neighboring group to form 5 or 6 member cyclic or aromatic ring system, and Group 2: aryl or substituted aryl of from 5 to 48 carbon atoms, or 4 to 48 carbon atoms necessary to complete a fused aromatic ring of naphthenyl, anthracenyl, pyrenyl, or perylenyl; and Group 3: heteroaryl or substituted heteroaryl of from 5 to 24 carbon atoms, or 4 to 48 carbon atoms necessary to complete a fused heteroaromatic ring of furyl, thienyl, pyridyl, quinolinyl and other heterocyclic systems; and Group 4: alkoxyl, amino, alkyl amino, aryl amino dialkyl amino, or diaryl amino of from 1 to 24 carbon atoms; and Group 5: a group consist of F, Cl, Br, I, CN, NCS, NCO, $B(OH)_2$, $B(OCH_2CH_2O)$, $B[OC(CH_3)_2C(CH_3)_2O]$, $SO_2R^{13}$, $SO_3R^{14}$, $SO_2NR_2$, $SiR_3$, $SiHR_2$, $SiR_2OH$, where R, $R^{13}$ and $R^{14}$ is hydrogen, chlorine, bromine, alkyl group containing 1–12 carbon atoms, and aryl; and Group 6: a group of formula $-LY_nR^{15}$ where n is 0 to 18, Y is a alkyl group contains 1 to 24 carbon atoms, $R^{15}$ is a hydrogen, hydroxy, amino, alkylamino, arylamino, alkyl arylamino, diarylamino, dialkylamino, or $-COR^{16}$ where $R^{16}$ is a hydrogen, chlorine, COCl, alkyl group containing 1–12 carbon atoms, $-NR_2$, $-NHR$ and aryl, or $-COOR^{17}$ where $R^{17}$ is a hydrogen, alkyl group containing 1–12 carbon atoms, aryl, COR, 2,4-dinitrophenyl, N-imido or $-NR_2$; and L is a direct bond or C=O.

It is another object of the present invention to provide organic EL device that has high efficiency and stability.

BRIEF DESCRIPTION OF THE DRAWINGS

These and other advantages of this invention can be better appreciated by reference to the following detailed description considered in conjunction with the drawings in which:

FIGS. 1, 2, and 3 are schematic diagrams of the multilayer structures of preferred EL devices which can employ this invention;

FIG. 4 depicts the EL spectra for undoped TBADN (Example 16) and TBADN doped with ARL-39 (Example 17) at a concentration of 1.1%, and TBADN doped with ARL-163 (Example 18) at a concentration of 1.0%. The EL spectra were measured at a drive current density of 20 mA/cm²;

FIG. 5 shows Spectra for B-39 as a function of doping concentration measured at a drive current density of 20 mA/cm²;

FIG. 6 illustrates the current density—voltage relation as a function of three doping concentration;

FIG. 7 shows Spectra for B-39 as a function of doping concentration measured at a drive current density of 20 mA/cm FIG. 8 illustrates the current density—voltage relation as a function of doping concentration; and FIG. 9. illustrates the current density—voltage relation for undoped TBADN layer, TBADN doped with 1.1% (v/v) B-163 and 1000 (Å) thick B-163 with no doping.

DETAILED DESCRIPTION OF THE PREFERRED EMBODIMENTS

There are numerous configurations of organic EL devices that include very simple structures comprising a single anode and cathode to more complex devices, such as passive matrix display comprised of orthogonal arrays of anodes and cathodes to form pixels, and active-matrix displays where each pixel is controlled independently, for example, with thin film transistors (TFTs).

The typical structure schematic diagrams of the multilayer structures of preferred EL devices that can employ this invention are detailed in FIG. 1, FIG. 2 and FIG. 3.

An EL device 100 that uses a compound according to the invention is schematically illustrated in FIG. 1. The support is layer 102 that is an electrically insulating and optically transparent material such as glass or plastic. Anode 104 is separated from cathode 106 by an organic EL medium 108, which, as shown, consists of two superimposed layers of organic thin films. Layer 110 located on the anode forms a hole-transport layer of the organic EL medium. Located above the hole-transport layer is layer 112, which forms an electron-transport layer of the organic EL medium. The anode and the cathode are connected to an external AC or DC power source 114 by conductors 116 and 118, respectively. The power source can be pulsed, periodic, or continuous.

In operation, the EL device can be viewed as a diode which is forward biased when the anode is at a higher potential then the cathode. Under these conditions, holes (positive charge carriers) are injected from the anode into the hole-transport layer, and electrons are injected into the electron-transport layer. The injected holes and electrons each migrate toward the oppositely charged electrode, as shown by the arrows 120 and 122, respectively. This results in hole-electron recombination and a release of energy in part as light, thus producing electroluminescence.

The region where the hole and electron recombine is known as the recombination zone. The two-layer device structure is designed specifically to confine the recombination at the vicinity near the interface between the hole-transport and the electron-transport layer where the probability for producing electroluminescence is the highest. This recombination confinement scheme has been disclosed by Tang and Van Slyke in Applied Physics Letters, Volume 51, Page 913, 1987 and is done by choosing carrier injecting electrodes of suitable work-functions and transport materials of a proper carrier mobility. Away from this interface between the organic layers and in particular at or near the injecting electrodes, the recombination of hole and electron would generally be much less radiative due to the effect of radiative quenching by a conducting surface.

Organic EL device 200 shown in FIG. 2 is illustrative of another EL device which can use the compound of the present invention. The insulating and transparent support is layer 202. The anode 204 is separated from the cathode 206 by an EL medium 208, which, as shown, consists of three superimposed layers of organic thin films. Layer 210 adjacent to anode 204 is the hole-transport layer. Layer 214 adjacent to cathode 206 is the electron-transport layer. Layer 212 which is in between the hole-transport layer and the electron transport layer is the luminescent layer. This luminescent layer also serves as the recombination layer where the hole and electron recombines.

The configurations of devices 100 and 200 are similar, except that an additional luminescent layer is introduced in device 200 to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as a high luminance efficiency. Likewise, the electron and hole transport layers can be optimized primarily for the carrier transport property.

Organic device 300 shown in FIG. 3 is illustrative of yet another EL device which can use the compound of the present invention. The insulating and transparent support is layer 302. The anode 304 is separated from the cathode 306 by an EL medium 308, which, as shown, consists of five superimposed layers of organic thin films. Located on top of the anode layer 304 are, in sequence, the hole-injection layer 310, the hole-transport layer 312, the luminescent layer 314, the electron-transport layer 316, and the electron-injection layer 318. The structure of device 300 is similar to device 200, except that a hole-injection layer and an electron injection layers are added to improve the injection efficiency of the respective anode and cathode. It is understood that an EL device may be constructed having either the hole or electron injection layer present in the organic EL medium without unduly compromising the device performance.

The present invention is particular useful for guest-host doped system of EL devices by doping in light emitting layer. It also can doped in hole transport layer, light emitting layer, and electron transport layer respectively or doped in any two or all three layer to optimize the best performance and achieve the desired transport and luminescent properties. One particular compound that is effective is the compound with structure of formula I:

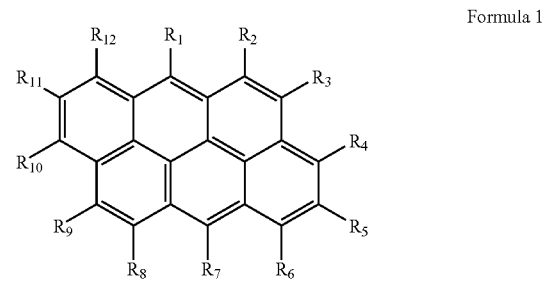

Formula 1 wherein:
$R^1$, $R^2$, $R^3$, $R^4$, $R^5$, $R^6$, $R^7$, $R^8$, $R^9$, $R^{10}$, $R^{11}$, and $R^{12}$ are individual substituents, each substituent is an individual group selected from the group consisting of hydrogen, halogens, and groups that contain 1 to 48 carbon atoms, and at least one group is not hydrogen.

Group 1: hydrogen, or alkyl of from 1 to 48 carbon atoms, and each $R^1$, $R^2$, $R^3$, $R^4$, $R^5$, $R^6$, $R^7$, $R^8$, $R^9$, $R^{10}$, $R^{11}$, and $R^{12}$ can connect with their neighboring group to form 5 or 6 member cyclic or aromatic ring system, and Group 2: aryl or substituted aryl of from 5 to 48 carbon atoms, or 4 to 48 carbon atoms necessary to complete a fused aromatic ring of naphthenyl, anthracenyl, pyrenyl, or perylenyl; and Group 3: heteroaryl or substituted heteroaryl of from 5 to 24 carbon atoms, or 4 to 48 carbon atoms necessary to complete a fused heteroaromatic ring of furyl, thienyl, pyridyl, quinolinyl and other heterocyclic systems; and Group 4: alkoxyl, amino, alkyl amino, aryl amino dialkyl amino, or diaryl amino of from 1 to 24 carbon atoms; and Group 5: a group consist of F, Cl, Br, I, CN, NCS, NCO, $B(OH)_2$, $B(OCH_2CH_2O)$, $B[OC(CH_3)_2C(CH_3)_2O]$, $SO_2R^{13}$, $SO_3R^{14}$, $SO_2NR_2$, $SiR_3$, $SiHR_2$, $SiR_2OH$, where R, $R^{13}$ and $R^{14}$ is hydrogen, chlorine, bromine, alkyl group containing 1–12 carbon atoms, and aryl; and Group 6: a group of formula -$LY_nR^{15}$ where n is 0 to 18, Y is a alkyl group contains 1 to 24 carbon atoms, $R^{15}$ is a hydrogen, hydroxy, amino, alkylamino, arylamino, alkyl arylamino, diarylamino, dialkylamino, or —$COR^{16}$ where $R^{16}$ is a hydrogen, chlorine, COCl, alkyl group containing 1–12 carbon atoms, —$NR_2$, —NHR and aryl, or —$COOR^{17}$ where $R^{17}$ is a hydrogen, alkyl group containing 1–12 carbon atoms, aryl, COR, 2,4-dinitrophenyl, N-imido or —$NR_2$; and L is a direct bond or C=O.

The substrate for the EL devices 100, 200, and 300 is electrically insulating and light transparent. The light transparent property is desirable for viewing the EL emission through the substrate. For applications where the EL emission is viewed through the top electrode, the transmissive characteristic of the support is immaterial, and therefore any appropriate substrate such as opaque semiconductor and ceramic wafers can be used. Of course, it is necessary to provide in these device configurations a light transparent top electrode.

The composition of the organic EL medium is described as follows, with particular reference to device structure 300.

A layer containing a porphyrinic compound forms the hole injecting layer of the organic EL device. A porphyrinic compound is any compound, natural or synthetic, which is derived from or includes a porphyrin structure, including porphine itself. Any of the prophyrinic compounds disclosed by Adler, U.S. Pat. No. 3,935,031 or Tang U.S. Pat. No. 4,356,429, the disclosures of which are here incorporated by reference, can be employed.

Preferred porphyrinic compounds are those of structural formula (II):

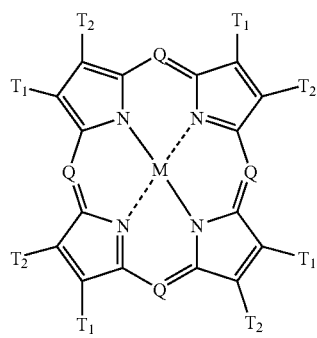

Formula II wherein Q is —N═. or —C(R)═.;

M is a metal, metal oxide, or metal halide;

R is hydrogen, alkyl, aralkyl, aryl, or alkaryl; and $T^1$ and $T^2$ represent hydrogen or together complete a unsaturated six member ring, which can include substituents, such as alkyl or halogen. Preferred six membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (II) by substitution of two hydrogens for the metal atom, as indicated by formula (III):

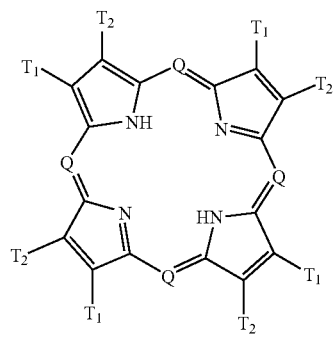

Formula III

Highly preferred examples of useful porphyrinic compounds are metal free phthalocyanines and metal containing phthalocyanines. While the porphyrinic compounds in general and the phthalocyanines in particular can contain any meal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following

Prophine 1,10,15,20-tetraphenyl-21H,23H-porphine copper (II)

1,10,15,20-tetrapheyl-21H,23H-porphine zinc (II)

Copper phthlocyanine

Chromium phthalocyanine fluoride

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

Another class of aromatic tertiary amines are those which include at least two aromatic tertiary amine moieties. Such compounds include those represented by structural formula (IV).

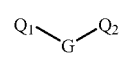

Formula IV wherein $Q^1$ and $Q^2$ are independently aromatic tertiary amine moieties and G is a linking group such as an arylene, cycloalkylene, or alkylene group of a carbon to carbon bond.

A preferred class of triarylamines satisfying structural formula (IV) and containing two triarylamine moieties are those satisfying structural formula (V):

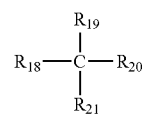

Formula V where R18 and R19 each independently represents a hydrogen atom, an aryl group, or an alkyl group or $R^1$ and $R^2$ together represent the atoms completing a cycloalkyl group and R20 and R21 each independently represents an aryl group which is in turn substituted with a diaryl substituted amino group, as indicated by structural formula (VI):

Formula VI wherein R22 and R23 are independently selected aryl groups.

Another preferred class of aromatic tertiary amines is tetraaryldiamines. Preferred tetraaryldiamines include two diarylamino groups, such as indicated by formula (VII), linked through an arylene group:

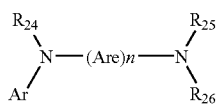

Formula VII wherein Are is an arylene group,
n is an integer of from 1 to 4, and
Ar, R.24, R25, and R26 are independently selected aryl groups.

The various alkyl, alkylene, aryl, and arylene moieties of the foregoing structural formulae (IV), (V), (VII), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Illustrative of useful hole transport compounds are the following:

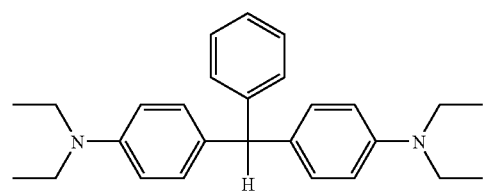

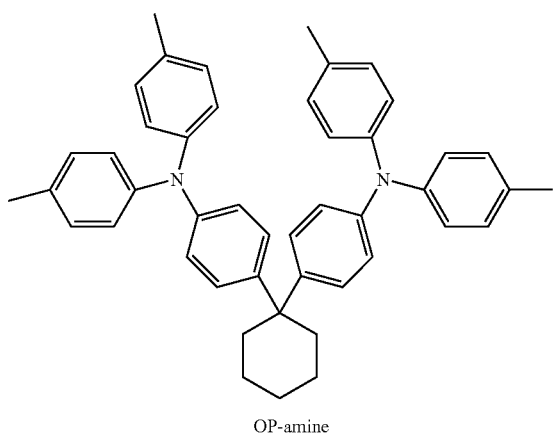

OP-amine

-continued

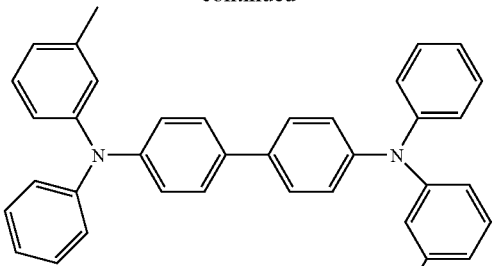

TPD

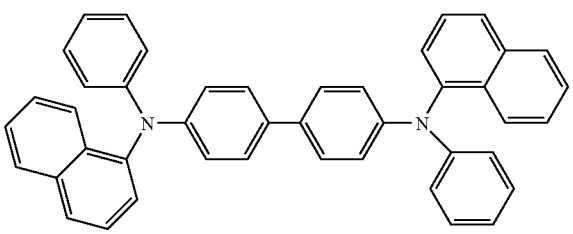

NPB

Another preferred class of aromatic hydrocarbons or fused aromatic hydrocarbons hole transport material disclosed in U.S. Pat. No. 6,465,115 by Shi et al. is extremely useful. Especially when hole transport layer was doped with guest components due to its non-polar property.

The luminescent layer of the organic EL medium comprises of a luminescent or fluorescent material where electroluminescence is produced as a result of electron-hole pair recombination in this region. In the simplest construction, the luminescent layer comprises of a single component that is a pure material with a high fluorescent efficiency. A well known material is tris(8-quinolinato)Aluminum, (Alq), which produces excellent green electroluminescence. A preferred embodiment of the luminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material.

Alq can only used as host material in doped light emitting layer to produce green and red emission. However, for the production of full-color EL display panel, it is necessary to have efficient red, green and, blue (RGB) EL materials. Especially important is the production of blue EL materials, because, given an efficient blue EL material, it is possible to produce other EL colors by a downhill energy transfer process. For instance, a green EL emission can be obtained by doping into a host blue EL material with a small amount of a green fluorescent sensitizing dye. This host-guest energy transfer scheme has been discussed in detail by Tang et al >U.S. Pat. No. 4,769,292. Similarly, a red EL color can be produced by doping the blue EL host material with a red fluorescent dye. In a somewhat analogous scheme, the fluorescent sensitizing dye may be placed outside the blue EL emitter to affect a shift in the EL emission wavelengths, as discussed by Imai U.S. Pat. No. 5,015,999. In this scheme, the sensitizing medium absorbs the blue photon generated by the blue EL emitter, which then emits at longer wavelengths.

To produce efficient blue emission through doped EL light emitting layer, it is extremely important to choose efficient host materials with wide energy band gap. Shi et al. in U.S. Pat. Nos. 5,645,948; 5,755,999; 5,972,247 and U.S. Pat. No. 5,935,721 has disclosed a few of classes of EL materials with wide energy band gap that are suitable to be used as host materials in light emitting layer to produce efficient blue emission. Classes of these disclosed EL host materials are preferred examples and can be used with present invention.

Illustrative of useful blue host compounds are the following:

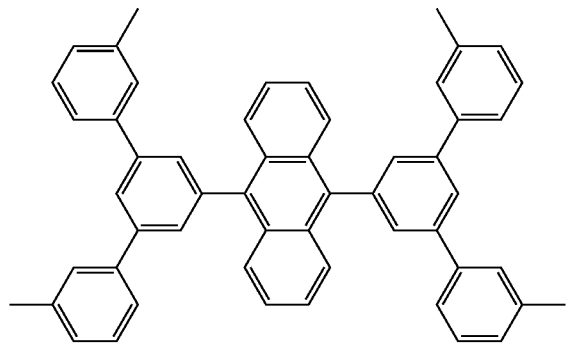

ADN

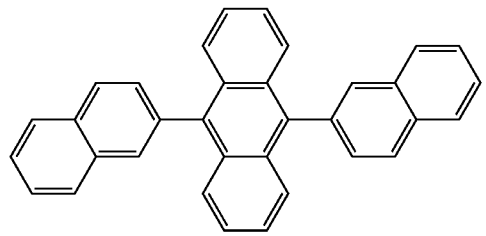

TBADN

Preferred materials for use in forming the electron transport layer of the organic EL devices of this invention are metal chelated oxinoid compounds, including chelates of oxine itself (also commonly referred to as 8-quinolinol or 8-hydroxyquinoline).

Preferred chelated oxinoid compounds are the following:
Aluminum trisoxine [tris(8-quinolinol)aluminum].
Magnesium bisoxine [bis(8-quinolinol)-magnesium]
Indium trisoxine [tris(8-quinolinol)indium]
Lithium oxine [8-quinolinol lithium]

Another preferred materials for use in forming the electron transporting layer (ETL) of the organic EL devices of this invention are the benzazole compound of molecular formula (VIII), which has been disclosed in detail by Shi et al in commonly-assigned U.S. Pat. No. 5,645,948.

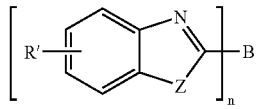

Formula VIII wherein:

n is an integer of from 2 to 8

Z is O, NR or S;

R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring B is a linkage unit consisting of alkyl, aryl, substituted alkyl, or substituted aryl which conjugatedly or unconjugatedly connects the multiple benzazoles together.

The preferred useful electron transport (ET) materials of this class are the following:

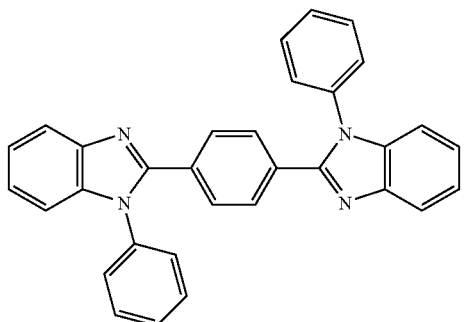

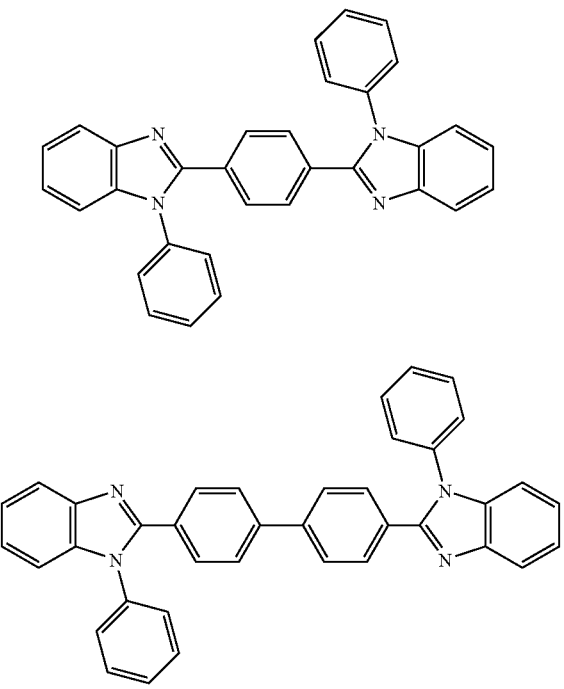

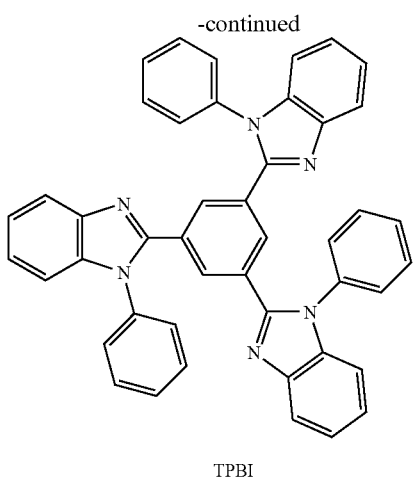

TPBI

The present invention is particular useful for guest-host doped system of EL devices by doping in light emitting layer. It also can doped in hole transport layer, light emitting layer, and electron transport layer respectively or doped in any two or all three layers to achieve the desired transport and light emitting performances.

The following anthanthrene molecular structures constitute of preferred luminescent dopants are typical useful for this improved organic EL device.

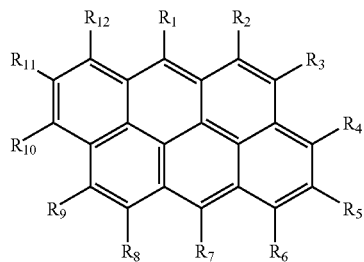

wherein:
$R^1$, $R^2$, $R^3$, $R^4$, $R^5$, $R^6$, $R^7$, $R^8$, $R^9$, $R^{10}$, $R^{11}$, and $R^{12}$ are individual substituents, each substituent is an individual group selected from the group consisting of hydrogen, halogens, and groups that contain 1 to 48 carbon atoms, and at least one group is not hydrogen.

Group 1: hydrogen, or alkyl of from 1 to 48 carbon atoms, and each $R^1$, $R^2$, $R^3$, $R^4$, $R^5$, $R^6$, $R^7$, $R^8$, $R^9$, $R^{10}$, $R^{11}$, and $R^{12}$ can connect with their neighboring group to form 5 or 6 member cyclic or aromatic ring system, and Group 2: aryl or substituted aryl of from 5 to 48 carbon atoms, or 4 to 48 carbon atoms necessary to complete a fused aromatic ring of naphthenyl, anthracenyl, pyrenyl, or perylenyl; and Group 3: heteroaryl or substituted heteroaryl of from 5 to 24 carbon atoms, or 4 to 48 carbon atoms necessary to complete a fused heteroaromatic ring of furyl, thienyl, pyridyl, quinolinyl and other heterocyclic systems; and Group 4: alkoxyl, amino, alkyl amino, aryl amino dialkyl amino, or diaryl amino of from 1 to 24 carbon atoms; and Group 5: a group consist of F, Cl, Br, I, CN, NCS, NCO, $B(OH)_2$, $B(OCH_2CH_2O)$, $B[OC(CH_3)_2C(CH_3)_2O]$, $SO_2R^{13}$, $SO_3R^{14}$, $SO_2NR_2$, $SiR_3$, $SiHR_2$, $SiR_2OH$, where R, $R^{13}$ and $R^{14}$ is hydrogen, chlorine, bromine, alkyl group containing 1–12 carbon atoms, and aryl; and Group 6: a group of formula $-LY_nR^{15}$ where n is 0 to 18, Y is a alkyl group contains 1 to 24 carbon atoms, $R^{15}$ is a hydrogen, hydroxy, amino, alkylamino, arylamino, alkyl arylamino, diarylamino, dialkylamino, or —$COR^{16}$ where $R^{16}$ is a hydrogen, chlorine, COCl, alkyl group containing 1–12 carbon atoms, —$NR_2$, —NHR and aryl, or —$COOR^{17}$ where $R^{17}$ is a hydrogen, alkyl group containing 1–12 carbon atoms, aryl, COR, 2,4-dinitrophenyl, N-imido or —$NR_2$; and L is a direct bond or C=O.

The following molecular structures constitute specific examples of anthanthrene derivatives represented by present invention. These compounds (preferred but not limited) are particularly useful as luminescent materials in optical electronics devices, more specifically in organic EL devices.

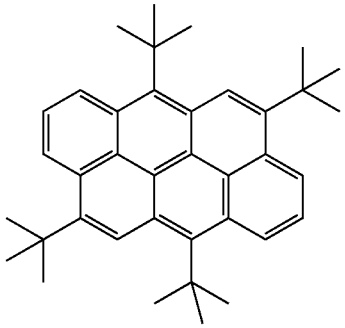

B-01

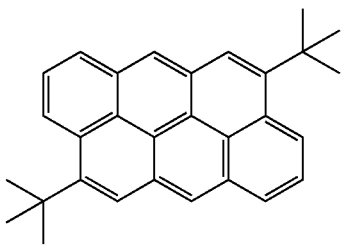

B-02

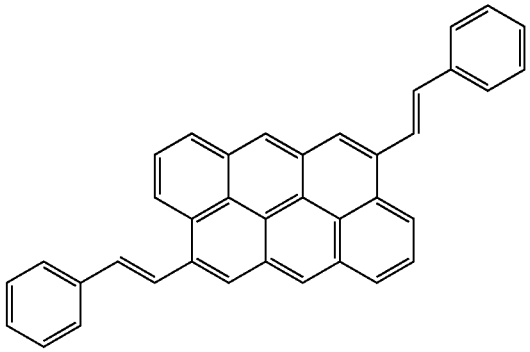

B-03

-continued
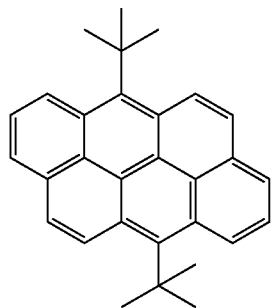
B-04
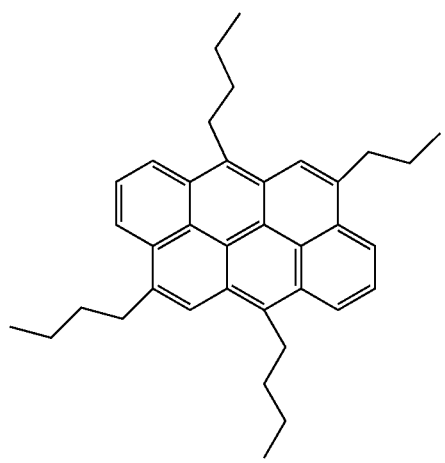
B-05
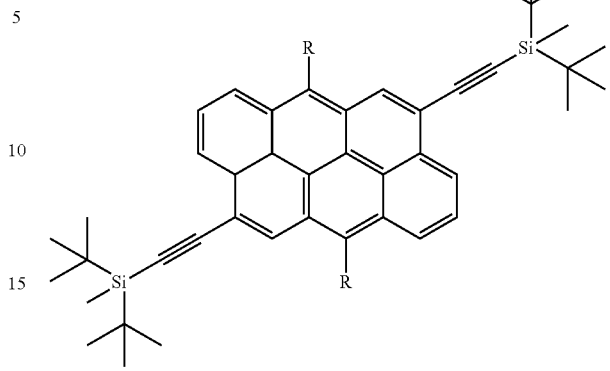
B-11 R=H
B-12 R=T-butyl
B-13 R=Phenyl
B-14 R=4-t-butylphenyl
B-15 R=4'-(trimetylsilyl)phenyl
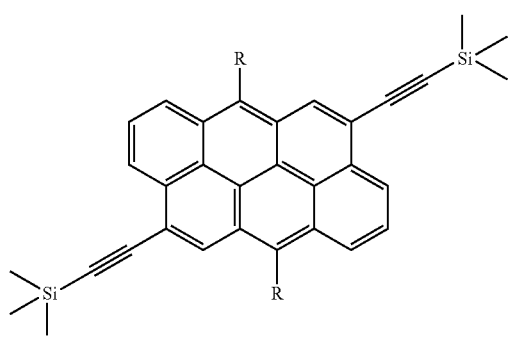
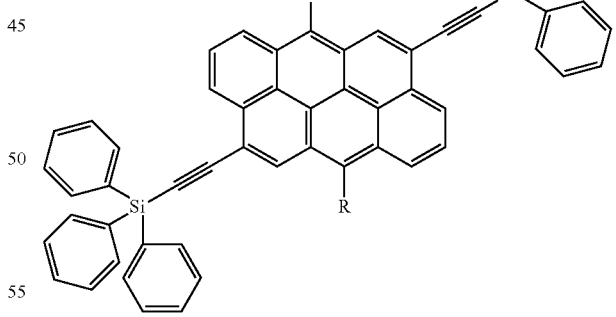
B-06 R=H
B-07 R=T-butyl
B-08 R=Phenyl
B-09 R=4-t-butylphenyl
B-10 R=4'-(trimetylsilyl)phenyl
B-16 R=H
B-17 R=T-butyl
B-18 R=Phenyl
B-19 R=4-t-butylphenyl
B-20 R=4'-(trimetylsilyl)phenyl

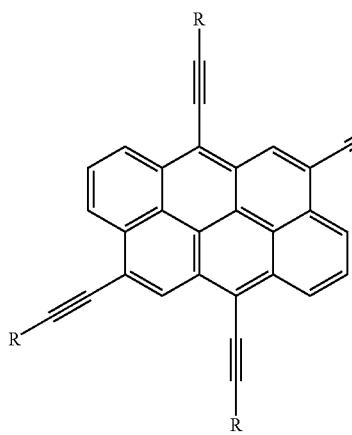
B-21 R=H
B-22 R=T-butyl
B-23 R=Phenyl
B-24 R=4-t-butylphenyl
B-25 R=4'-(trimetylsilyl)phenyl
B-26
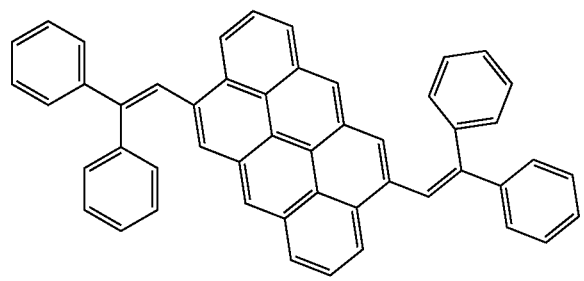
B-27
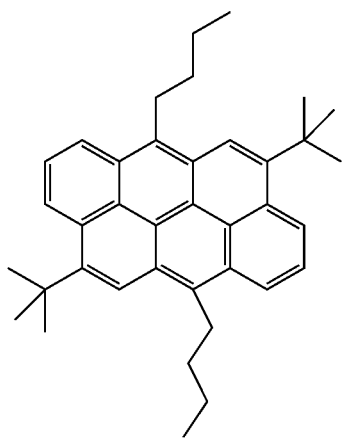
-continued
B-28
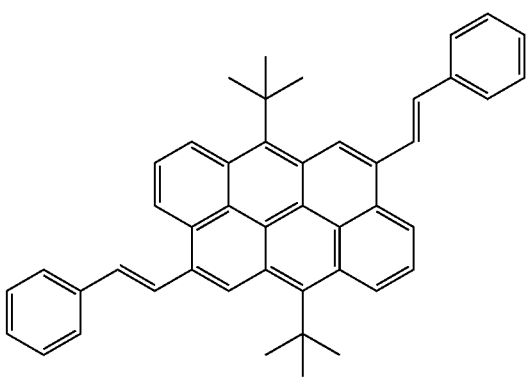
B-29
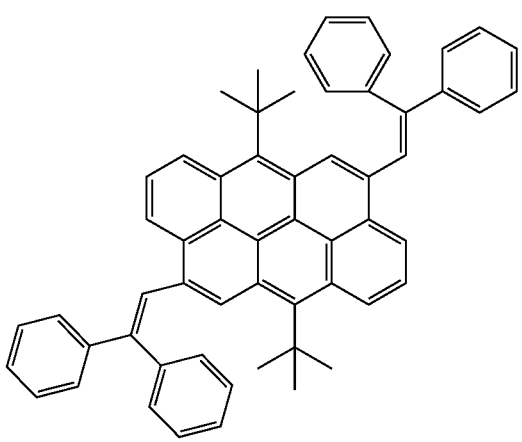
B-30
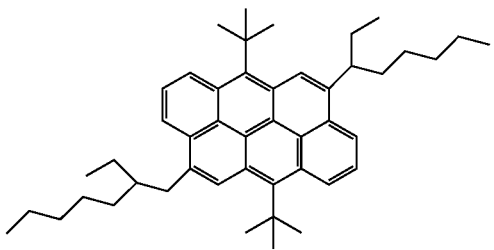
B-31
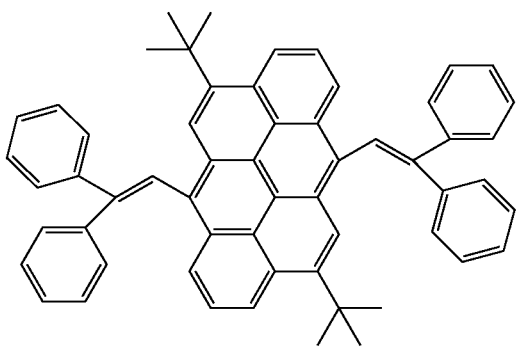

-continued
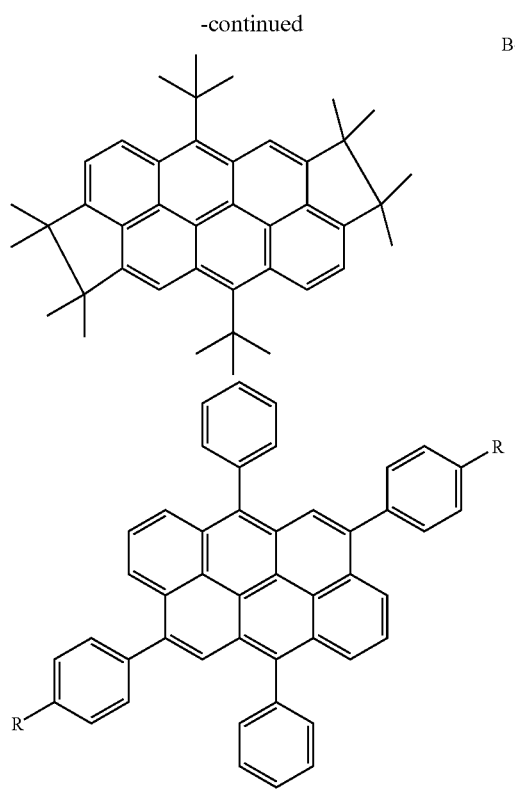
B-33 R=H
B-34 R=t-butyl
B 35 R=trimethylsilyl
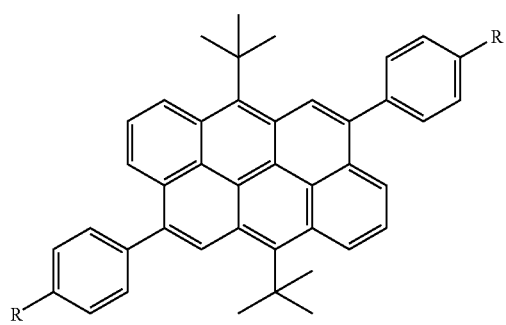
B-36 R=H
B-37 R=t-butyl
B 38 R=trimethylsilyl
B-32
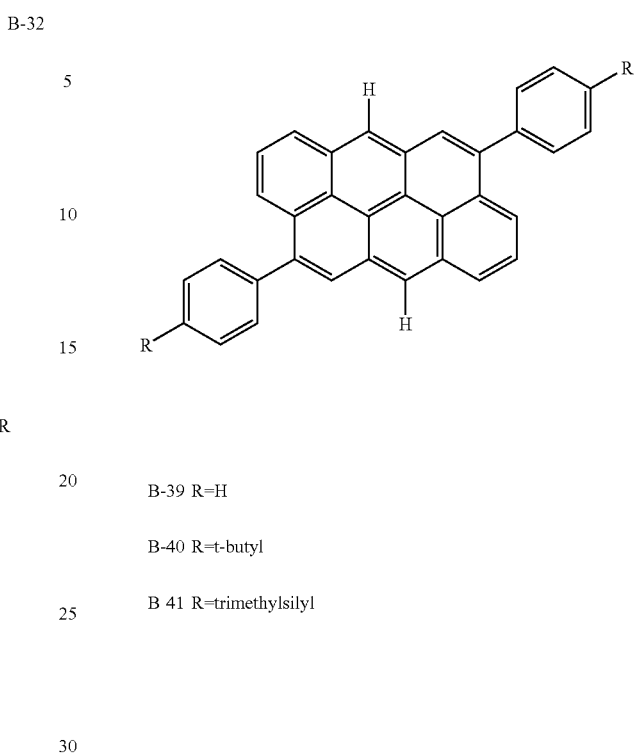
B-39 R=H
B-40 R=t-butyl
B 41 R=trimethylsilyl
B-42
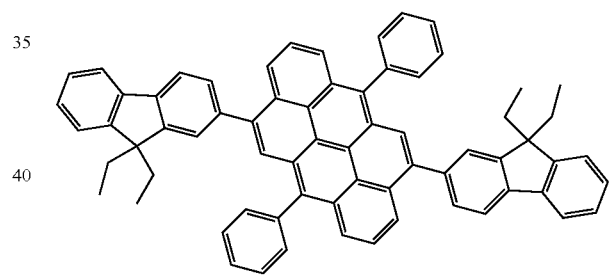
B-43
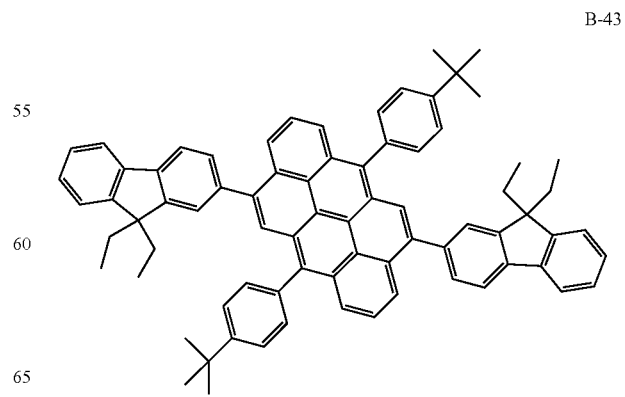

B-44
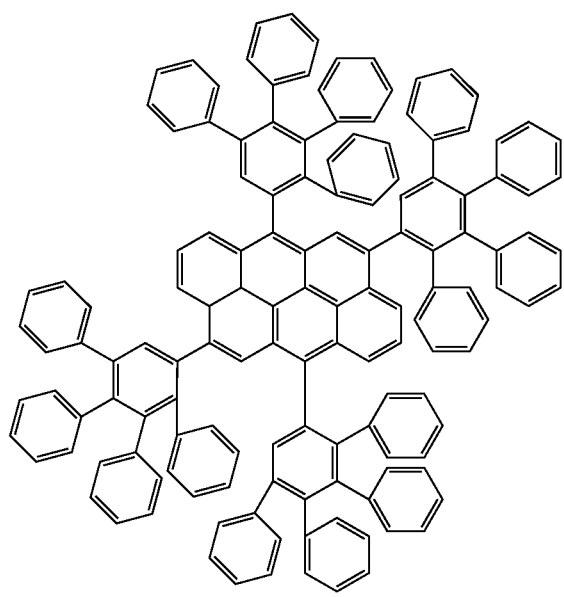
B-45
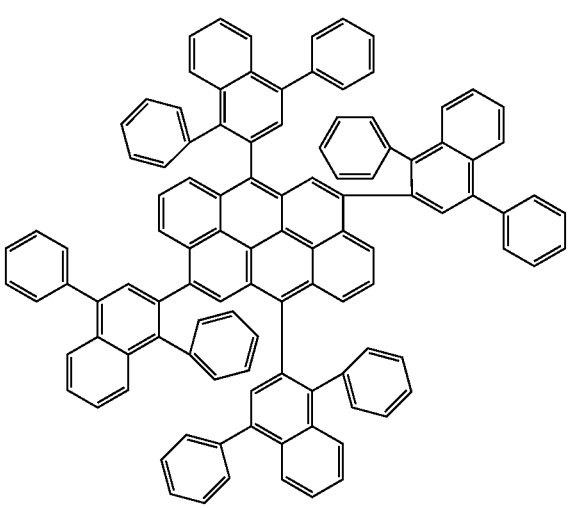
B-46
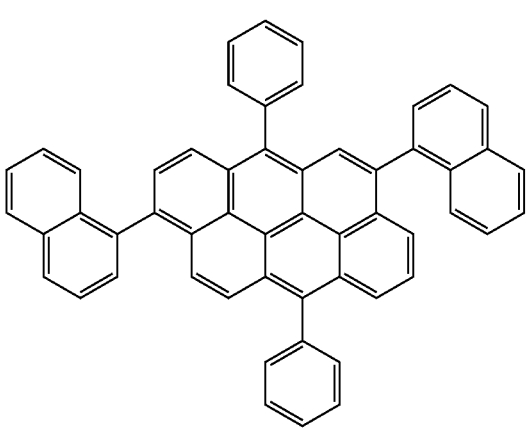
B-47
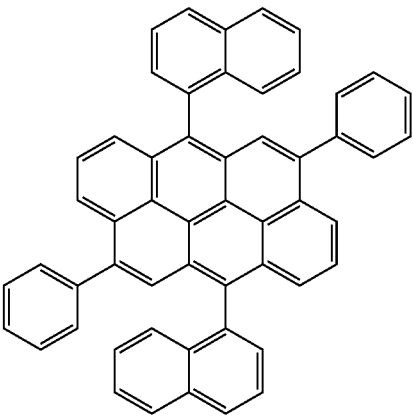
B-47
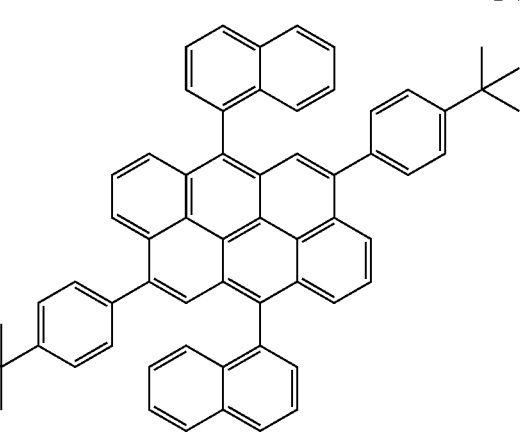
B-48
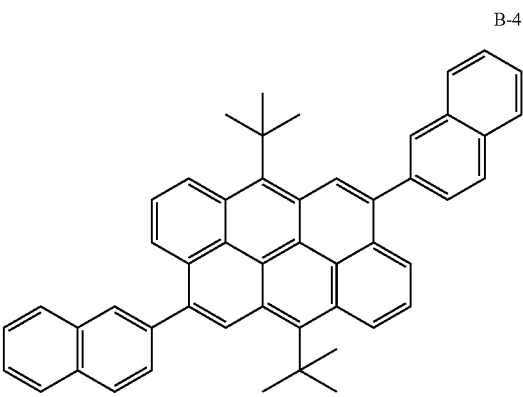
B-49
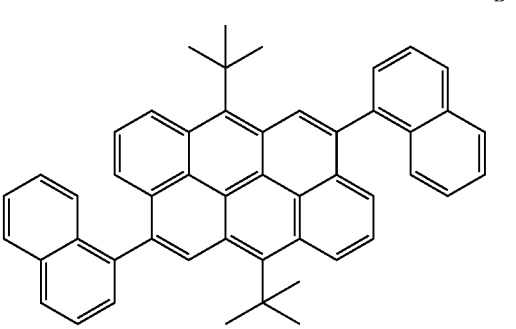

-continued
B-50
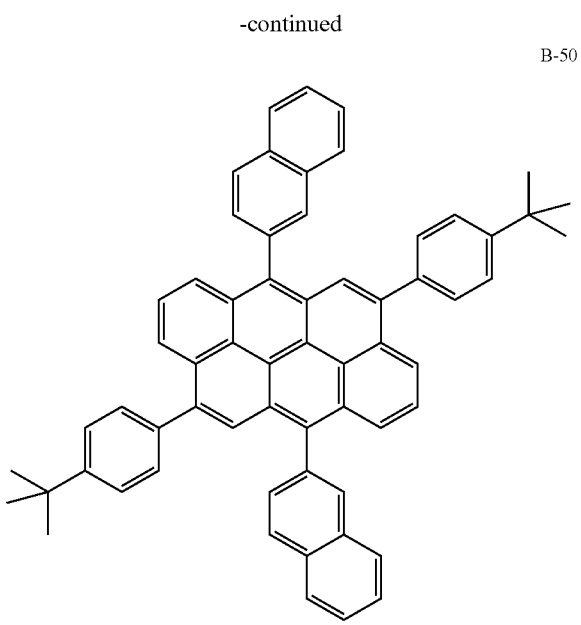
B-53
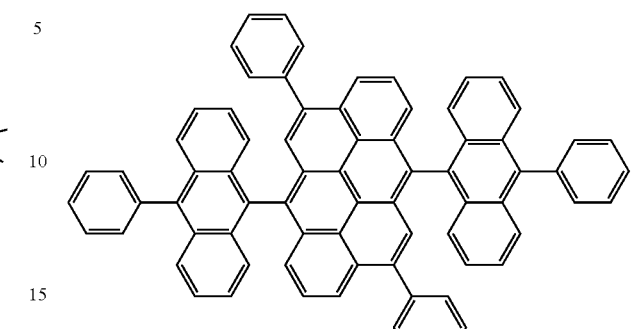
B-51
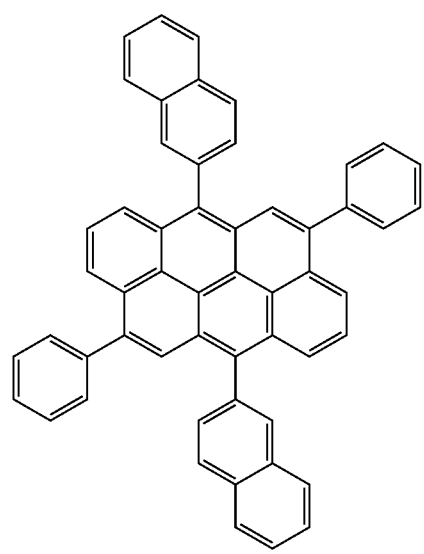
B-54
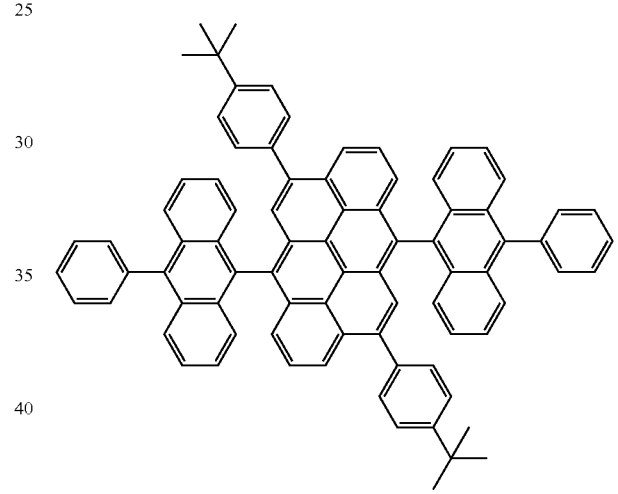
B-52
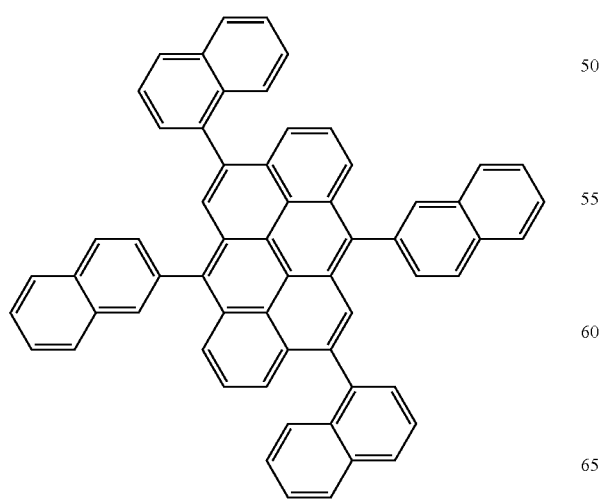
B-55
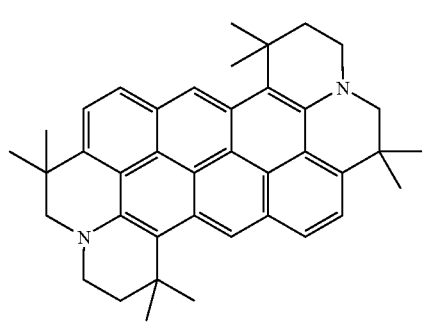

-continued
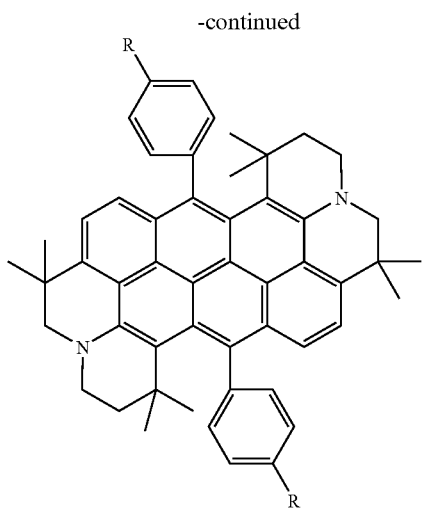
B-56 R=H
B-57 R=t-butyl
B-58 R=4'-trimetylsily
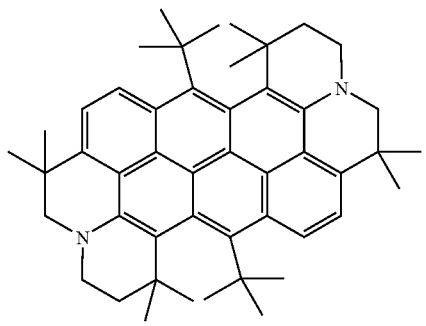
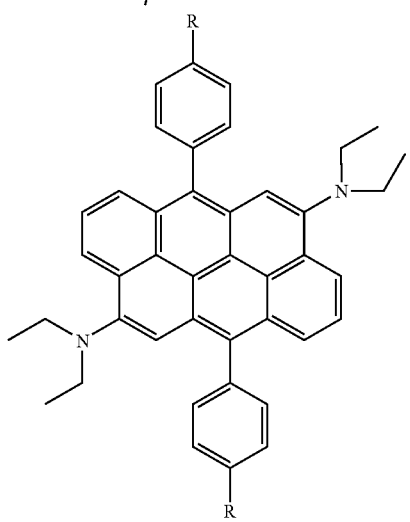
B-60 R=H
B-61 R=t-butyl
B-62 R=4'-trimetylsily
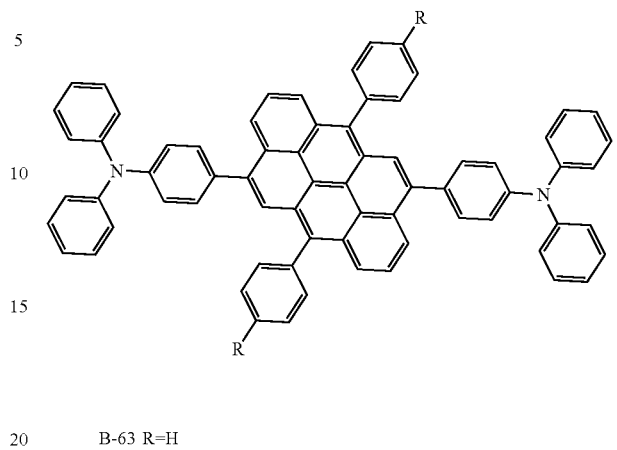
B-63 R=H
B-64 R=t-butyl
B-65 R=4'-trimetylsily
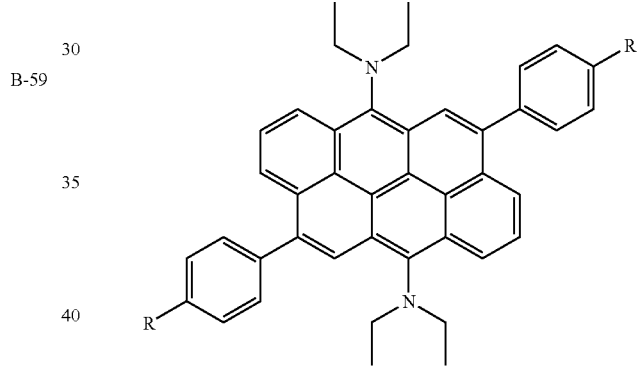
B-66 R=H
B-67 R=t-butyl
B-68 R=4'-trimetylsily
B-69
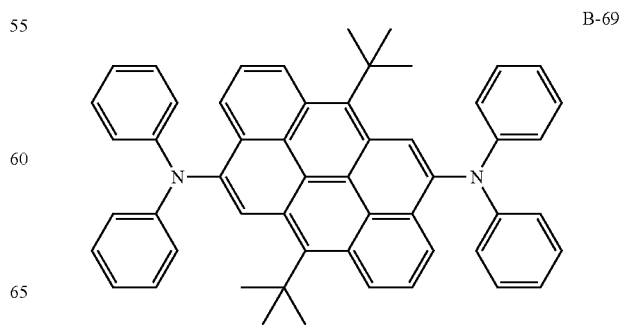

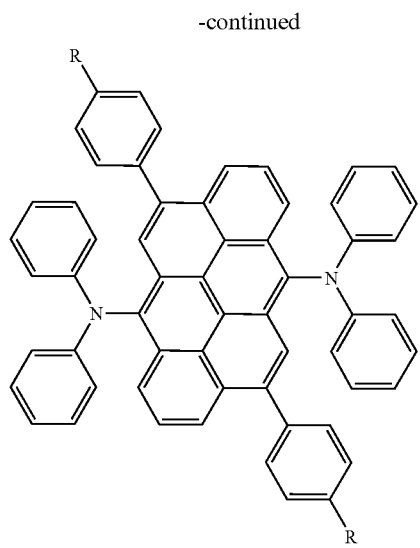
B-70 R=H
B-71 R=t-butyl
B-72 R=4'-trimetylsily
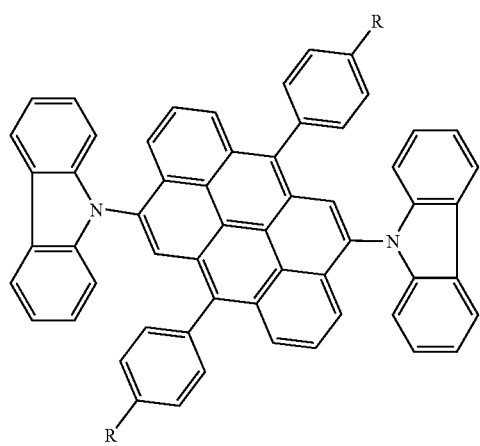
B-73 R=H
B-74 R=t-butyl
B-75 R=4'-trimetylsily
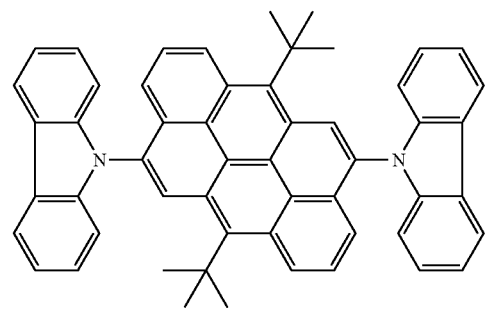
B-76
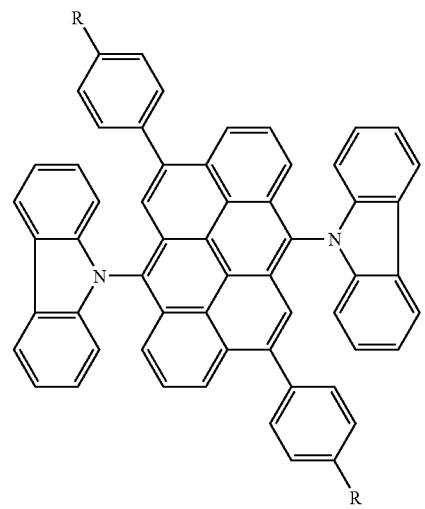
B-77 R=H
B-78 R=t-butyl
B-79 R=4'-trimetylsily

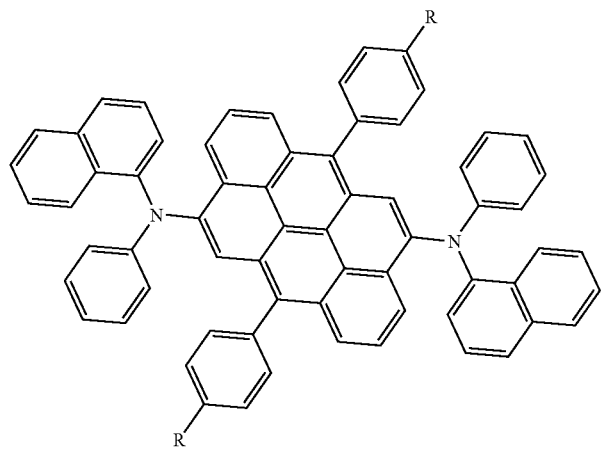
B-80 R=H
B-81 R=t-butyl
B-82 R=4'-trimetylsily
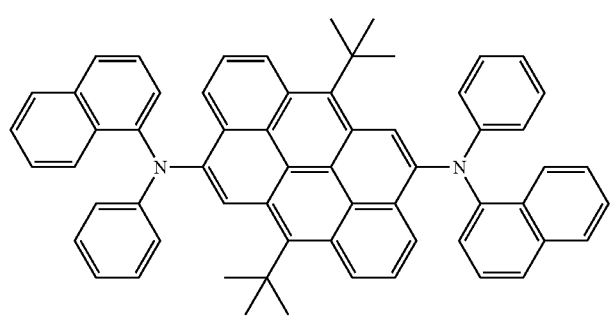
B-83
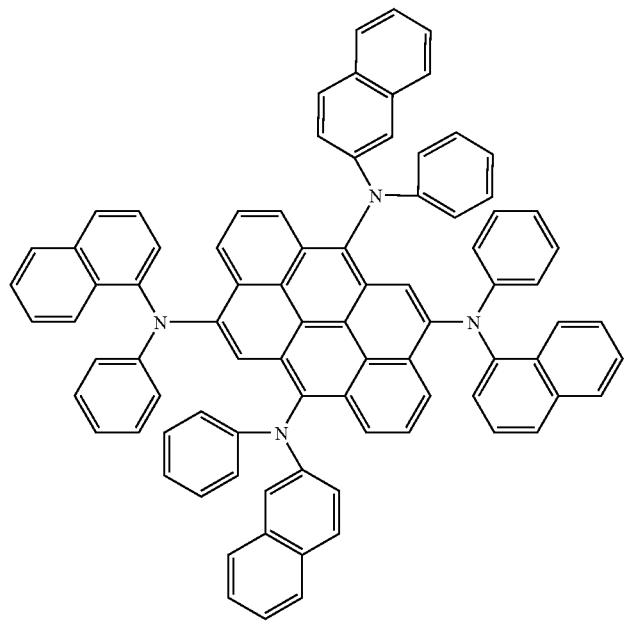
B-84

-continued
B-85
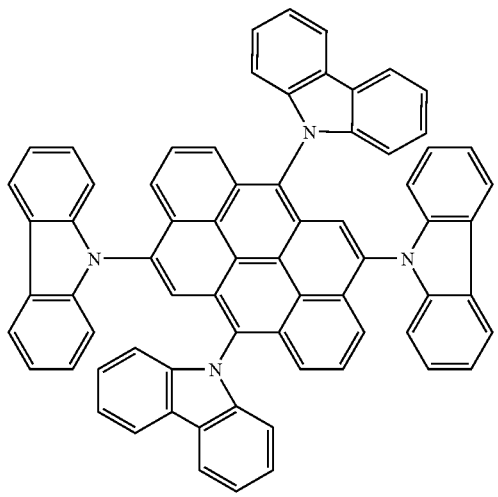
B-86
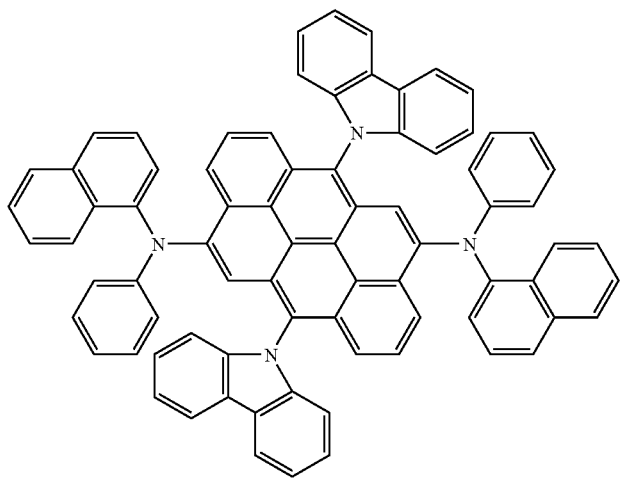
B-87
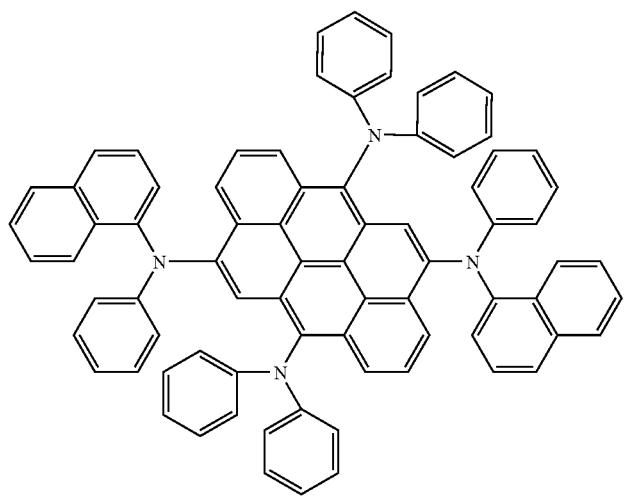

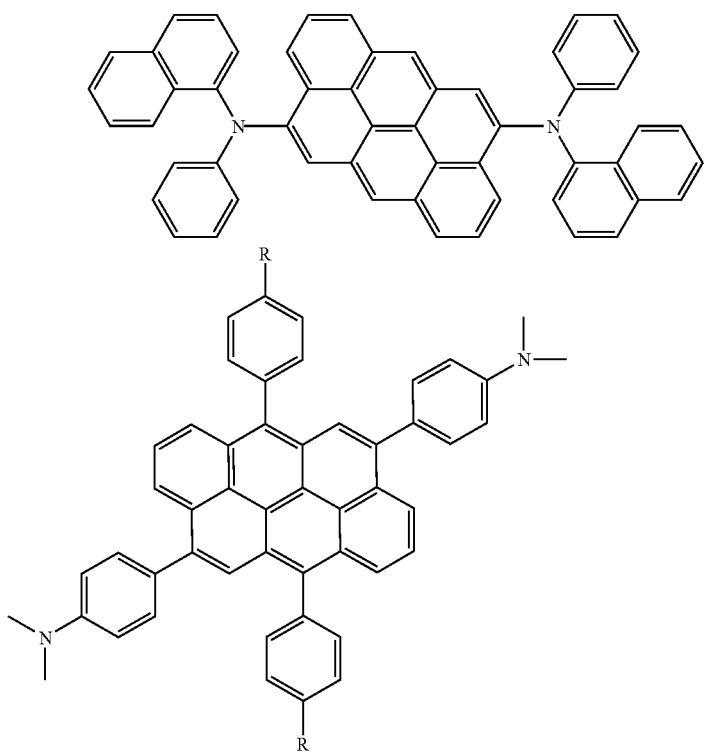
B-89 R=H
B-90 R=t-butyl
B-91 R=4'-trimetylsily
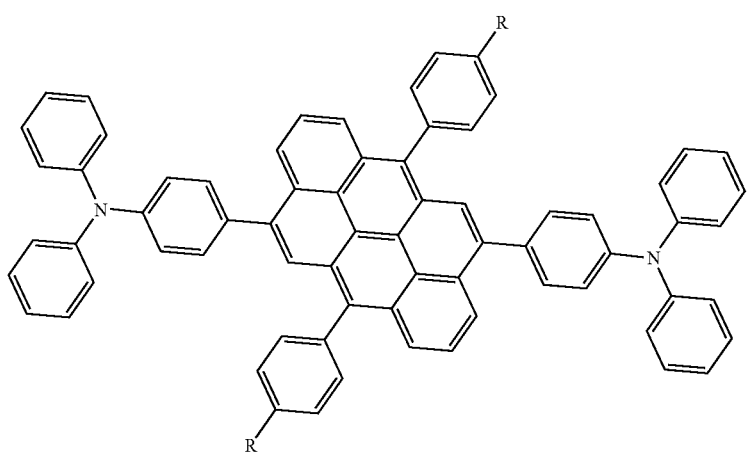
B-92 R=H
B-93 R=t-butyl
B-94 R=4'-trimetylsily

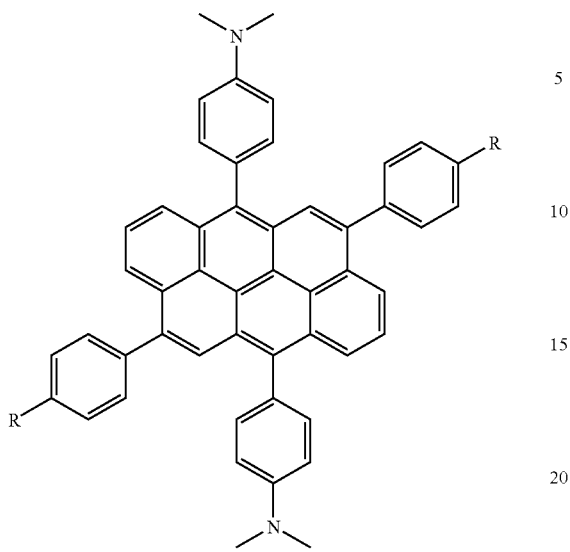
B-95 R=H
B-96 R=t-butyl
B-97 R=4'-trimetylsily
B-98
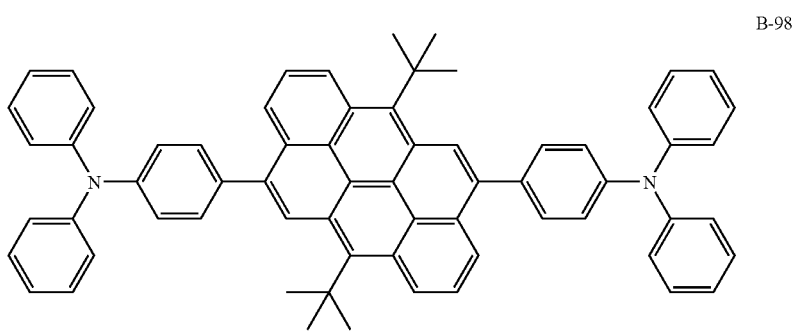
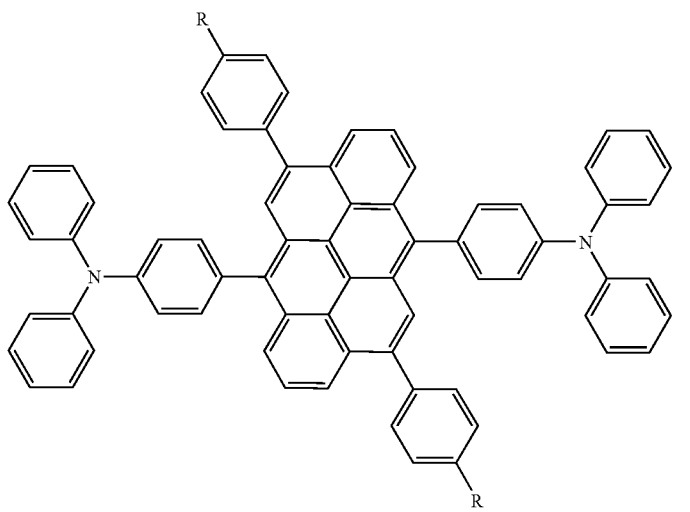

B-99 R=H
B-100 R=t-butyl
B-101 R=4'-trimetylsily
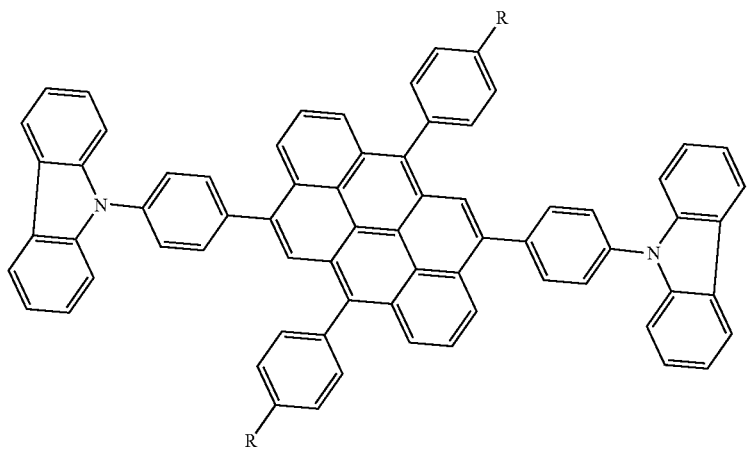
B-102 R=H
B-103 R=t-butyl
B-104 R=4'-trimetylsily
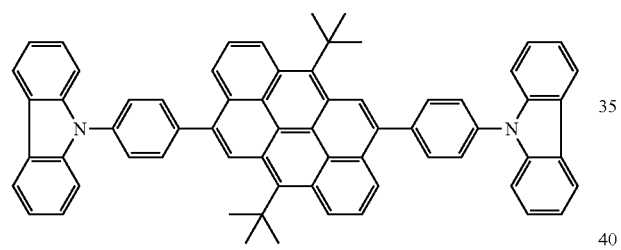
B-105 R=H
B-106 R=t-butyl
B-107 R=4'-trimetylsily
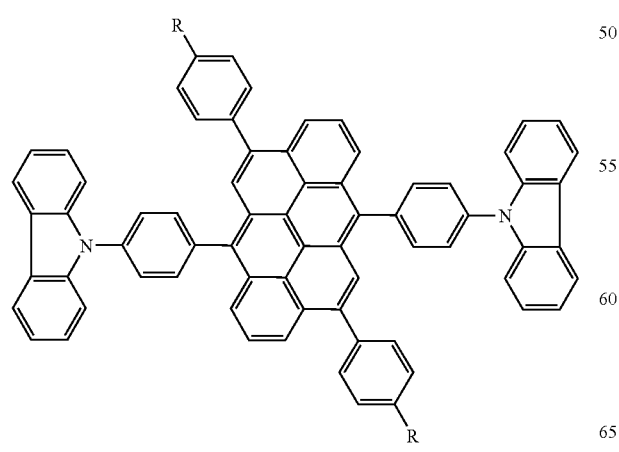
B-108 R=H
B-109 R=t-butyl
B-110 R=4'-trimetylsily
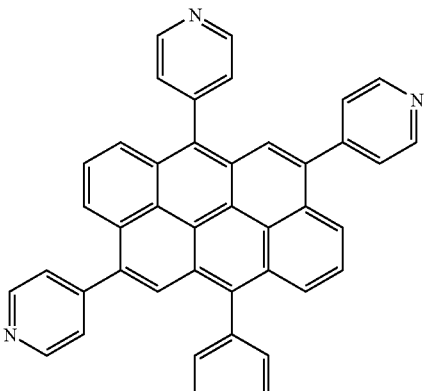
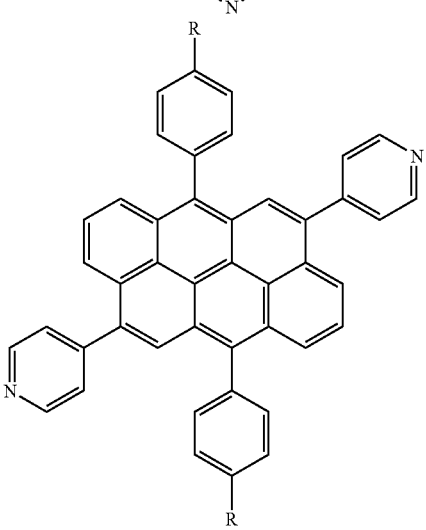

B-111 R=H
B-112 R=t-butyl
B-113 R=4'-trimetylsily
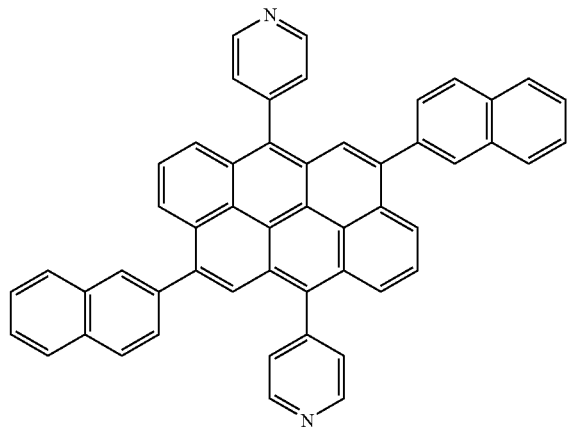
B-114 R=H
B-115 R=t-butyl
B-116 R=4'-trimetylsily
B-117
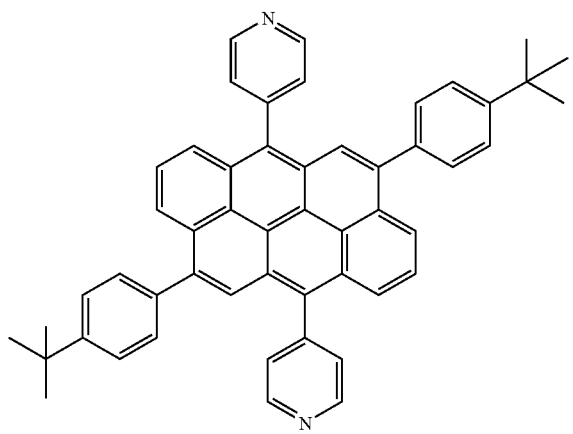
-continued
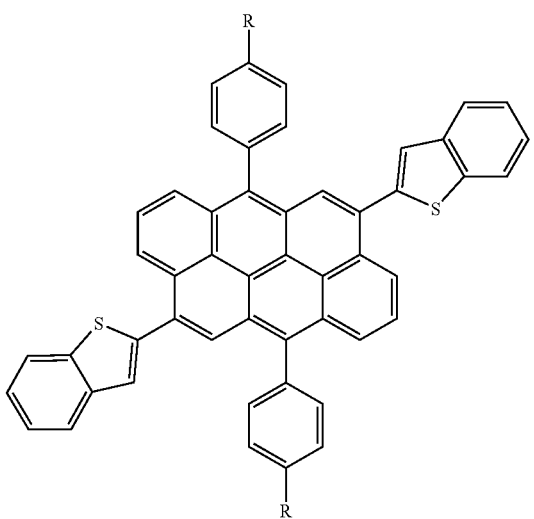
B-118 R=H
B-119 R=t-butyl
B-120 R=4'-trimetylsily
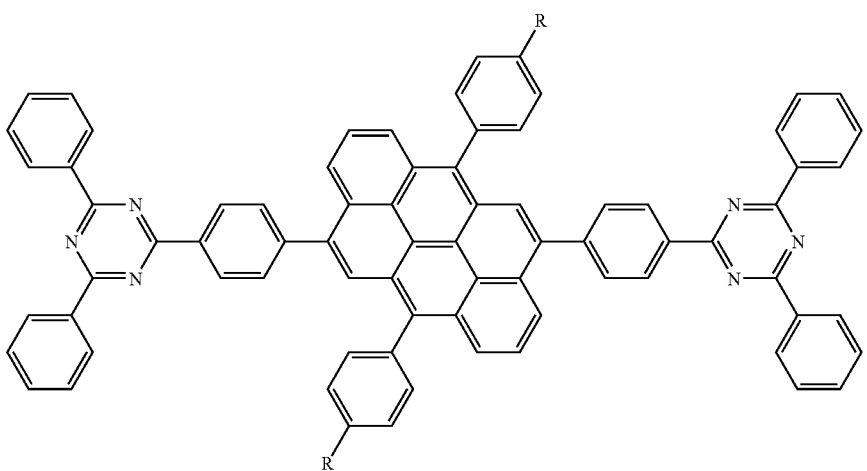

B-121 R=H
B-122 R=t-butyl
B-123 R=4'-trimetylsily
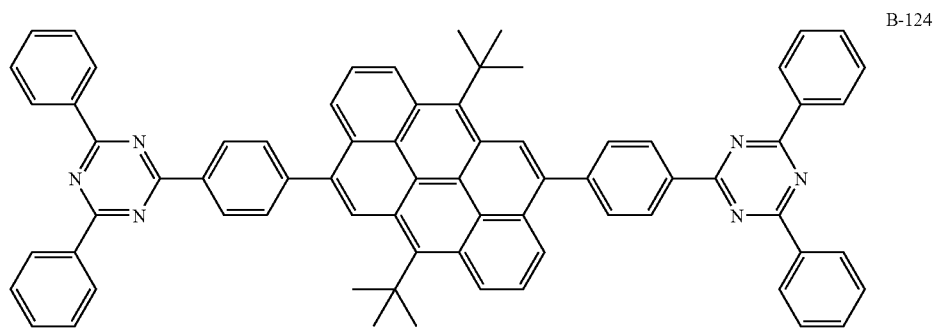
B-124
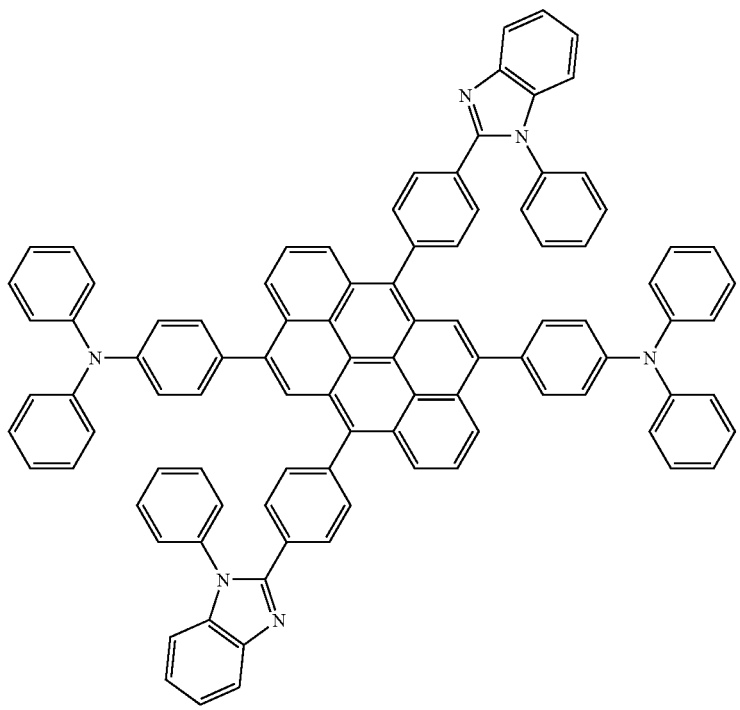
B-125

-continued
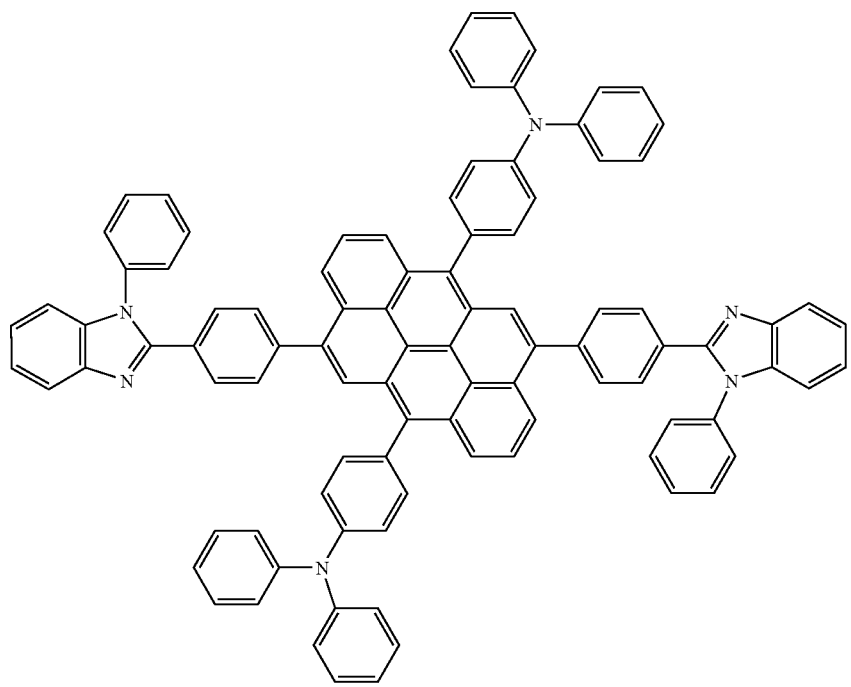
B-126
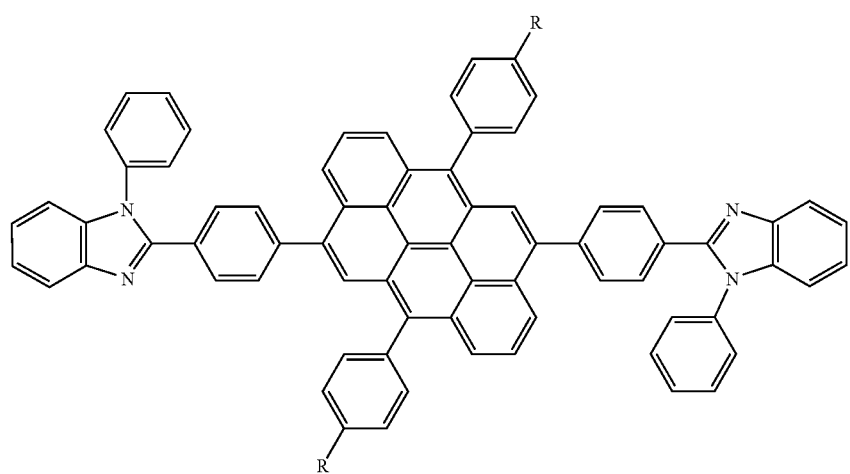
B-127 R=H
B-128 R=t-butyl
B-129 R=4'-trimetylsily

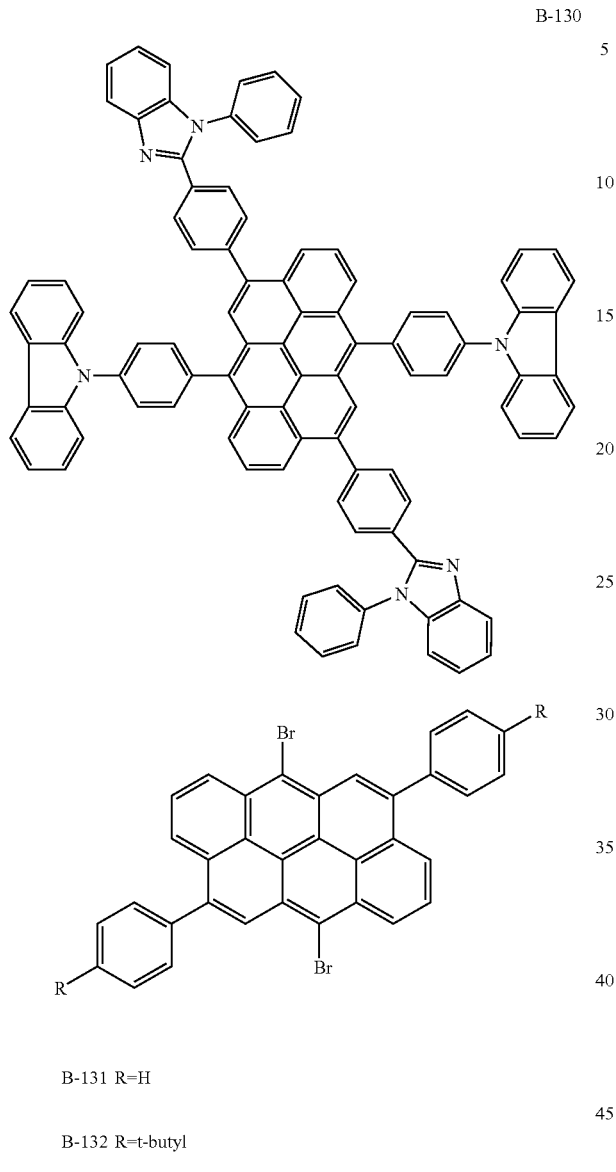
B-131 R=H
B-132 R=t-butyl
B-133 R=trimetylsily
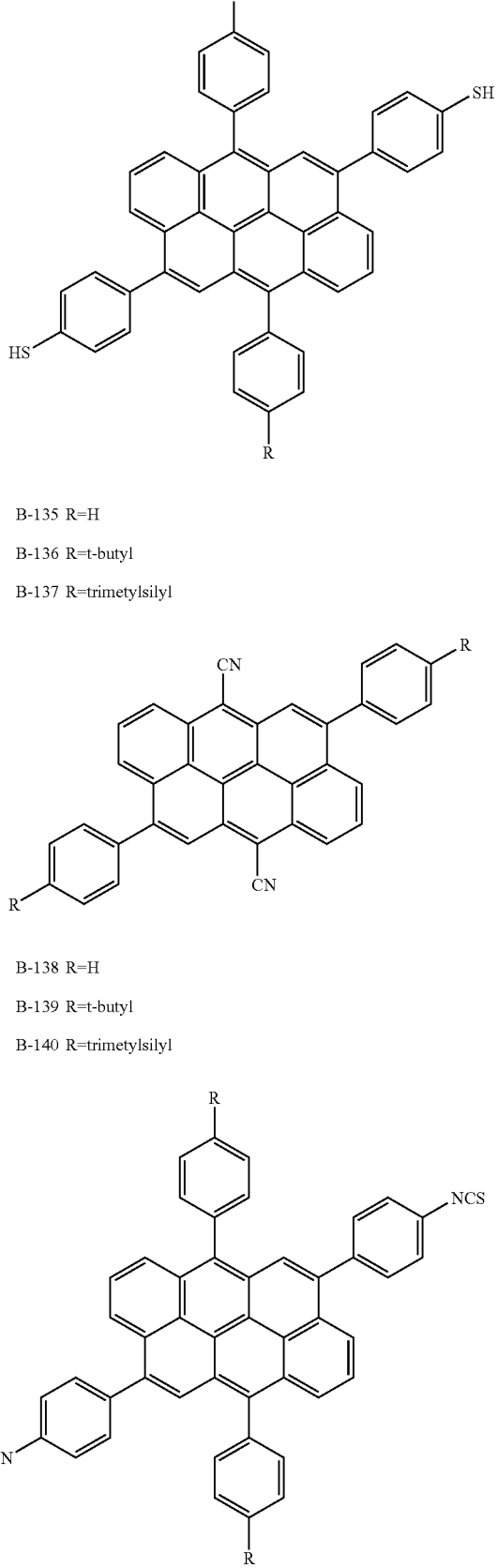
B-135 R=H
B-136 R=t-butyl
B-137 R=trimetylsilyl
B-138 R=H
B-139 R=t-butyl
B-140 R=trimetylsilyl B-141 R=H
B-142 R=t-butyl
B-143 R=trimetylsilyl
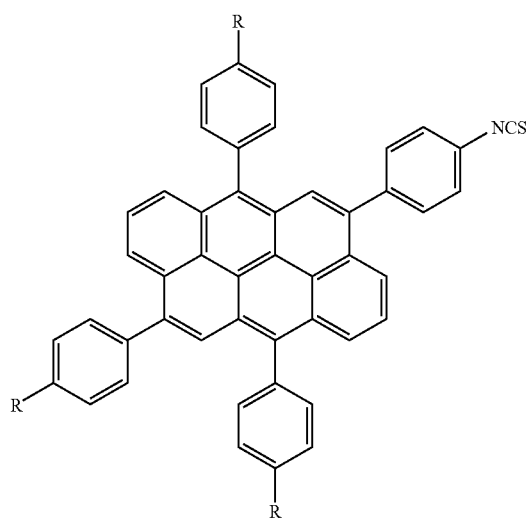
B-144 R=H
B-145 R=t-butyl
B-146 R=trimetylsilyl
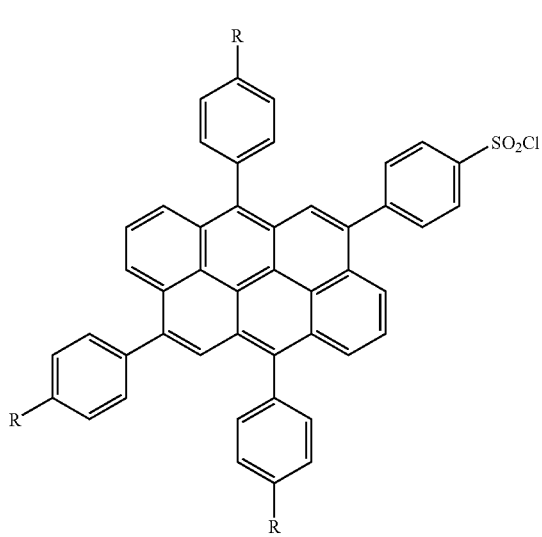
B-147 R=H
B-148 R=t-butyl
B-149 R=trimetylsilyl
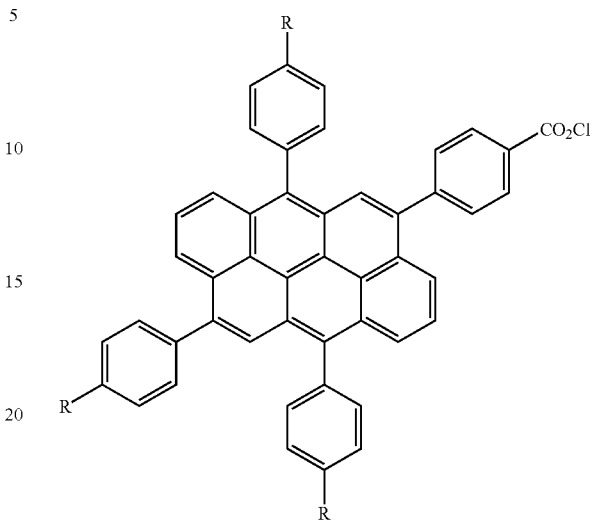
B-150 R=H
B-151 R=t-butyl
B-152 R=trimetylsilyl
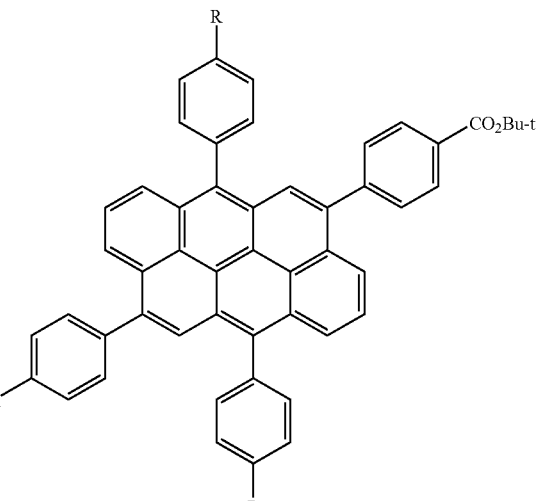
B-153 R=H
B-154 R=t-butyl
B-155 R=trimetylsilyl

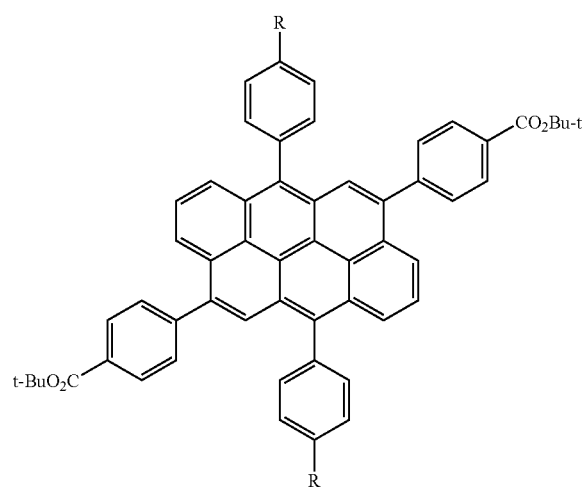
B-156 R=H
B-157 R=t-butyl
B-158 R=trimetylsilyl
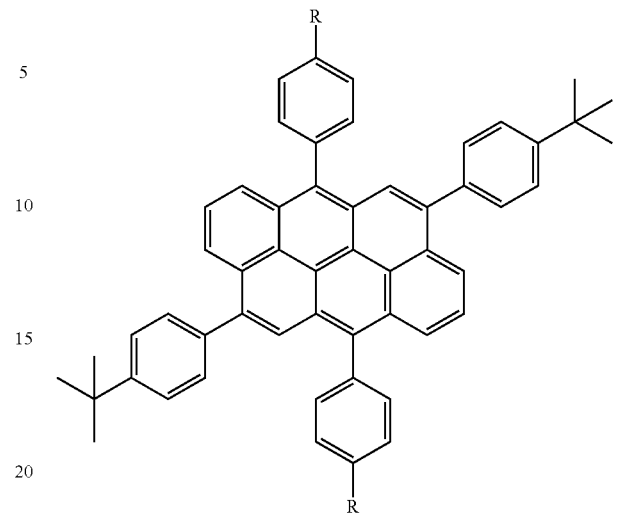
B-162 R=H
B-163 R=t-butyl
B-164 R=trimetylsilyl
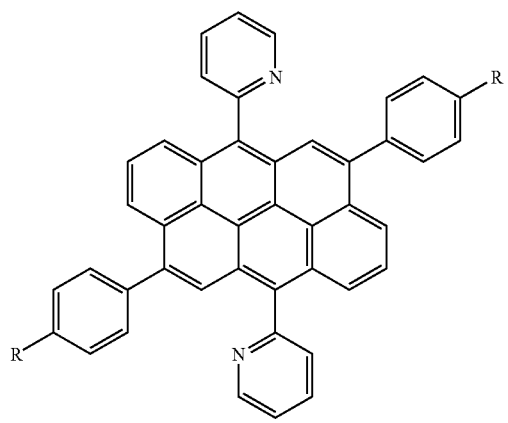
B-159 R=H
B-160 R=t-butyl
B-161 R=trimetylsilyl
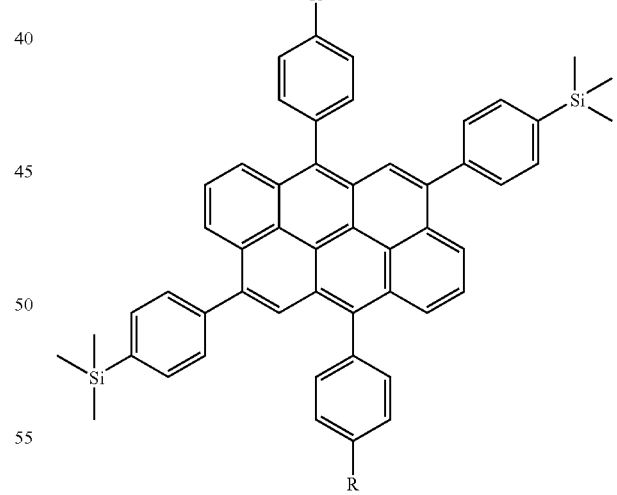
B-165 R=H
B-166 R=t-butyl
B-167 R=trimetylsilyl

B-168

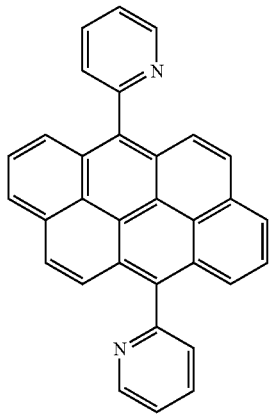

B-169

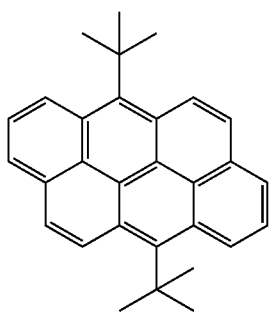

B-170 R=H

B-171 R=t-butyl

B-172 R=trimetylsilyl

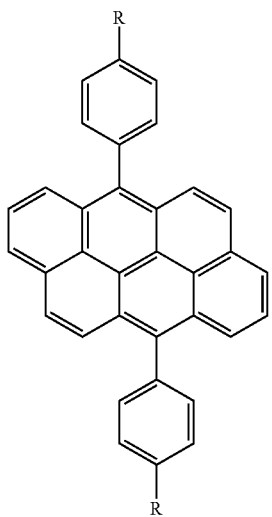

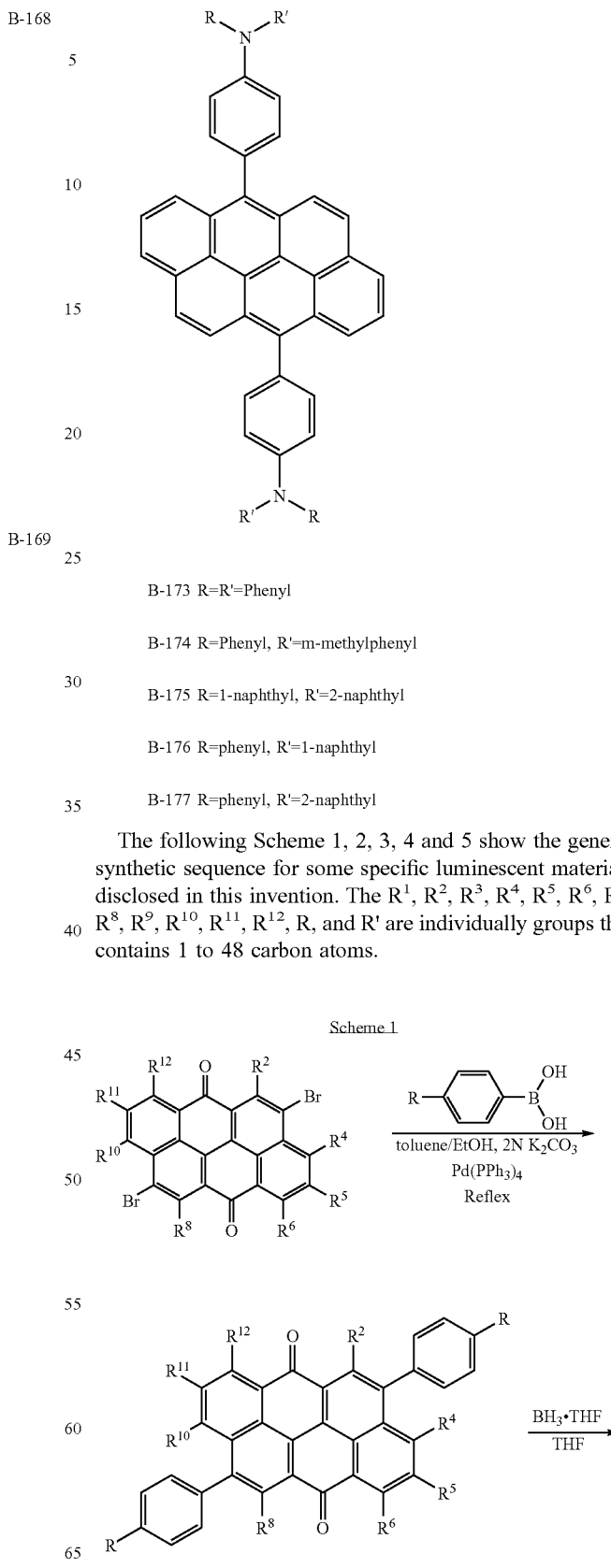

B-173 R=R'=Phenyl

B-174 R=Phenyl, R'=m-methylphenyl

B-175 R=1-naphthyl, R'=2-naphthyl

B-176 R=phenyl, R'=1-naphthyl

B-177 R=phenyl, R'=2-naphthyl

The following Scheme 1, 2, 3, 4 and 5 show the general synthetic sequence for some specific luminescent materials disclosed in this invention. The $R^1$, $R^2$, $R^3$, $R^4$, $R^5$, $R^6$, $R^7$, $R^8$, $R^9$, $R^{10}$, $R^{11}$, $R^{12}$, R, and R' are individually groups that contains 1 to 48 carbon atoms.

-continued

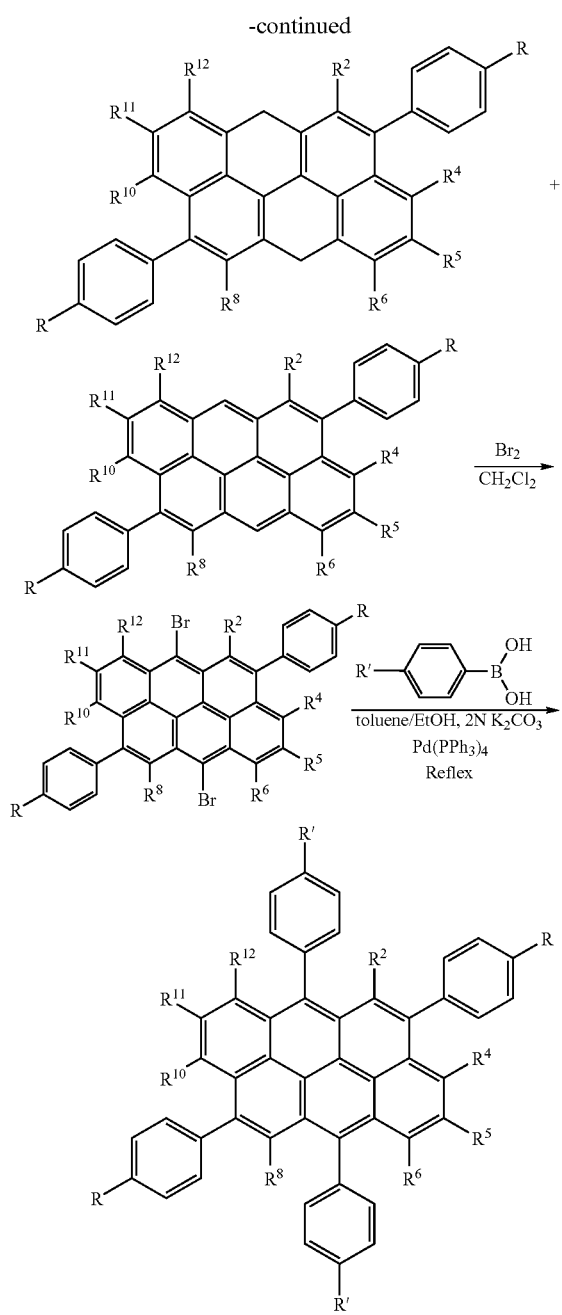

The preferred materials for the multi-layers of the organic EL medium are each capable of film-forming, that is, capable of being fabricated as a continuous layer having a thickness of less than 5000 .ANG. A preferred method for forming the organic EL medium is by vacuum vapor deposition. Extremely thin defect-free continuous layers can be formed by this method. Specifically, the individual layer thickness as low as about 50 .ANG. can be constructed while still realizing satisfactory EL device performance. It is generally preferred that the overall thickness of the organic EL medium be at least about 1000 .ANG.

Other methods for forming thin films in EL devices of this invention include spin-coating from a solution containing the EL material. A combination of spin-coating method and vacuum vapor deposition method is also useful for the fabrication of multi-layer EL devices.

The anode and cathode of the organic EL device can each take any convenient conventional form. Where it is intended to transmit light from the organic EL device through the anode, this can be conveniently achieved by coating a thin conductive layer onto a light transparent substrate—e.g., a transparent or substantially transparent glass plate or plastic film. In one form the organic EL devices of this invention can follow the historical practice of including a light transparent anode formed of tin oxide or indium tin oxide coated on a glass plate, as disclosed by Gurnee et al U.S. Pat. No. 3,172,862, Gurnee U.S. Pat. No. 3,173,050, Dresner "Double Injection Electroluminescence in Anthracene", RCA Review, Volume 30, pages 322–334, 1969; and Dresner U.S. Pat. No. 3,710,167 cited above.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein.

EXAMPLES

The invention has been described in detail with particular reference to certain preferred embodiments thereof, but it will be understood that variations and modifications can be effected within the spirit and scope of the invention. The invention and its advantages are further illustrated by the specific examples as follows:

Synthesis of 4,10-diaryl-dibenzo[def,mno]chrysene-6,12-dione

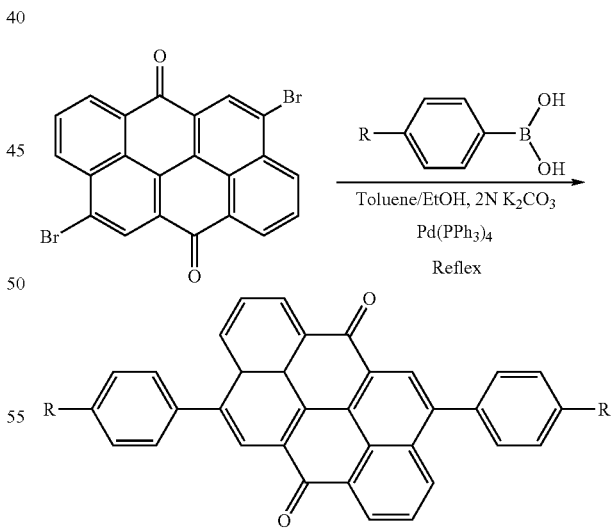

Dione 1. R = H
Dione 2 R = t-Butyl
Dione .3 R = trimetylsily

The synthesis of 4,10-diaryl-dibenzo[def,mno]chrysene-6,12-dione was illustrated by following detailed preparation procedure of 4,10-Diphenyl-dibenzo[def,mno]chrysene-6, 12-dione (Dione 1). The Dione 2 and Dione 3 were prepared under similar general conditions.

Example 1

Synthesis of 4,10-Dipheny-dibenzo[def,mno]chrysene-6,12-dione (Dione 1)

To a 3 L of three neck flask were charged with 30 0 g (0.065 mol.) of 4,10-Dibromo-dibenzo[def,mno]chrysene-6, 12-dione, 17.8 g (0.146 mol.) of phenyl boronic acid, and 0.2 g of 18-c-6 in a mixture of 1200 mL of toluene, 300 mL of ethanol, and 250 mL of 2.0 N potassium carbonate. After mixture was bubbled with house nitrogen for 15 min, 0.3 g of Pd (PPh$_3$)$_4$ was added to the reaction mixture under nitrogen. Then the reaction mixture was heated to reflux with efficient stirring under nitrogen protection. After the reaction proceeded for three hours, 0.2 g of Pd (PPh$_3$)$_4$ was added to the reaction mixture under nitrogen. The reaction mixture was continued to reflux for overnight. The newly formed orange solid was suspended in organic layer. After cool the reaction mixture to room temperature, the water phase was separated. The organic layer (with newly formed orange solid was suspended) was washed with water for three times (3×300 mL). The orange precipitates was filtered and washed with acetone (for easy dry). A 28.8 g of pure 4,10-Diphenyl-dibenzo[def,mno]chrysene-6,12-dione was obtained. Yield is in 96.5%.

Example 2

Synthesis of 4,10-Bis-(4-tert-butyl-phenyl)-dibenzo [def,mno]chrysene-6,12-dione (Dione 2)

Dione 2 was prepared by similar procedure described in Example 1. Yield is in 95.7%.

Example 3

Synthesis of 4,10-Bis-(4-trimethylsilylphenyl)-dibenzo[def,mno]chrysene-6,12-dione (Dione 3)

Dione 3 was prepared by similar procedure described in Example 1. Yield is in 92.5%.

Synthesis of 4,10-diaryl-dibenzo[def,mno]chrysene

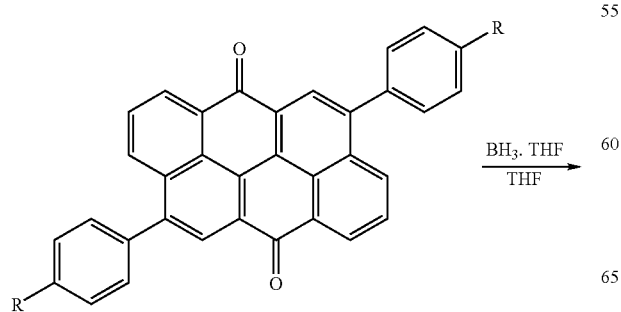

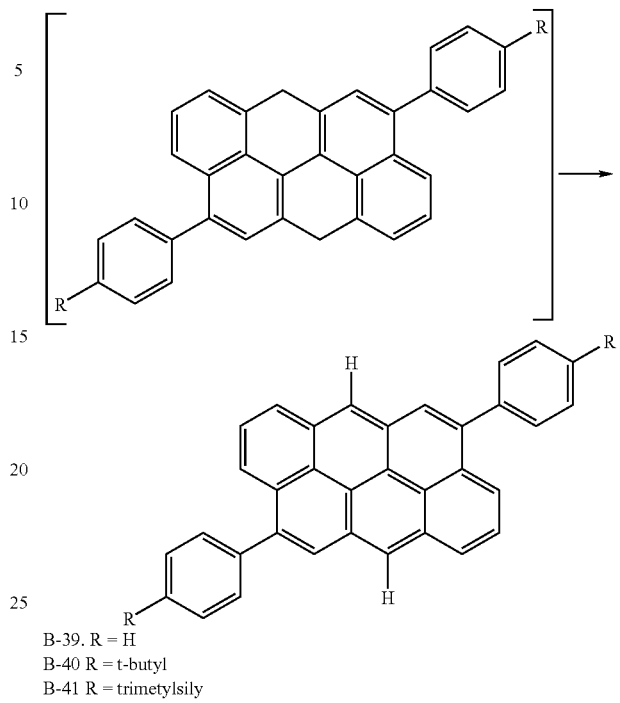

B-39. R = H
B-40 R = t-butyl
B-41 R = trimetylsily

The synthesis of 4,10-diaryl-dibenzo[def,mno]chrysene was illustrated by following detailed preparation procedure of 4,10-Diphenyl-dibenzo[def,mno]chrysene. (B-39). The B-40 and B-41 were prepared under similar general conditions.

Example 4

Synthesis procedure of 4,10-diaryl-dibenzo[def,mno]chrysene (B-39)

To a 1 L of three neck flask with nitrogen protected condenser were charged with 500 mL of anhydrous tetrahydrfuran (THF) containing 9.2 g (0.02 mol.) of 4,10-Diphenyl-dibenzo[def,mno]chrysene-6,12-dione. Then 20 mL of 1.0 M of boran etherate was added by syringe slowly to above solution. The reaction mixture was slowly warm to 70° C. while stirring until the reaction mixture change to a completely pale yellow solution and then another 5 mL of 0.1.0 M of boran etherate was added by syringe. The reaction was continued for another 1 hour at 70° C. The reaction mixture was cooled to room temperature and 15 mL of methanol was slowly added to quench the excess boran agent. After the bubbles were ceased, the solvents were removed with a rotary evaporator. The residue was added to 20 mL of ethanol and the precipitates were filtered and dried. The 6.4 g of pure 4,10-Diphenyl-dibenzo[def,mno]chrysene was obtained by nitrogen flow sublimation at 275~285° C. under 2 torr vacuum. Yield is in 74.8%.

Example 5

Synthesis of 4,10-Bis-(4-tert-butyl-phenyl)-dibenzo [def,mno]chrysene (B-40)

B-40 was prepared by similar procedure described in Example 4. Yield is in 78.5%.

Example 6

Synthesis of 4,10-Bis-(4-trimethylsilylphenyl)-dibenzo[def,mno]chrysene (B-41)

B-41 was prepared by similar procedure described in Example 4. Yield is in 72.5%.

Synthesis of 4,6,10,12-tetrakis-substituted-dibenzo[def,mno]chrysene

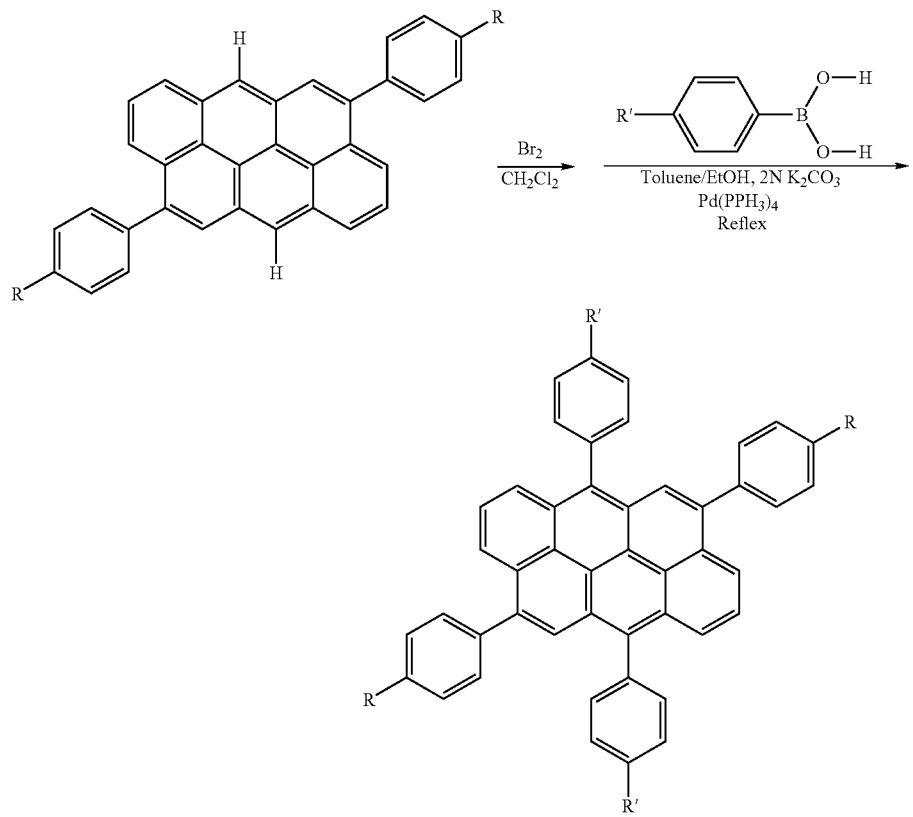

B-33. R = R' = H
B-34 R = H, R' = t-Butyl
B-35 R = H, R' = 4'-trimetylsily
B-162 R = t-Butyl, R' = H
B-163 R = t-Butyl  R' = t-butyl
B-164 R = t-Butyl, R' = trimetylsily
B-165. R = trimetylsily, R' = H
B-166 R = trimetylsily, R' = t-Butyl
B-167 R = R' = trimetylsilyl The synthesis of 4,6,10,12-tetrakis-substituted-dibenzo[def,mno]chrysene was illustrated by following detailed preparation procedure of 4,6,10,12-tetrakis-(4'-tert-butylphenyl)-dibenzo[def,mno]chrysene. (B-163). The B-33, B-34, B-35, B-162, B-164, B-1655, B-167 and B-168 were prepared under similar conditions. And Yields were list in Table 1.

Example 7

Synthesis of 4,6,10,12-tetrakis-(4'-t-butylphenyl)-dibenzo[def,mno]chrysene. (B-163)

To a 250 mL of round bottom flask were charged with 1.08 g (2.0 mmol.) of 4,10-bis-(t-butylphenyl)dibenzo[def,mno] (B-33) and 100 mL. The resulted suspension was subjected in ultrasonic bath for 15 minutes to break the big particles as small as possible. Then 0.89 g (5.8 mmol) of bromine in 10 mL of dichloromethane was added drop by drop to the reaction mixture with stirring. The bromine color disappeared about 5 minutes after the addition. Then the reaction was continued for another 15 minuets. The solvent was removed via vacuum rotary evaporator. The crude 4,6-(4'-t-butylphenyl)-10,12-dibromodibenzo[def,mno]chrysene was used for next step reaction without further purification.

To above reaction flask contianing crude 4,6-(4'-t-butylphenyl)-10,12-dibromodibenzo[def,mno]chrysene were charged with 1.1 g (6.0 mmol) of 4-t-butylphenyl boronic acid, and 50 mg of 18-c-6 in a mixture of 70 mL of toluene, 30 mL of ethanol, and 25 mL of 2.0 N potassium carbonate. After mixture was bubbled with house nitrogen for 5 min, 0.1 g of Pd (PPh$_3$)$_4$ was added to the reaction mixture under nitrogen. Then the reaction mixture was heated to reflux with efficient stirring under nitrogen protection. After the reaction proceeded for three hours, 50 mg of Pd (PPh$_3$)$_4$ was added to the reaction mixture under nitrogen. The reaction mixture was continued to reflux for two hours. The reaction mixture was cooled to room temperature and water phase was separated. The organic layer with the dissolved precipitates was washed with water three times (3×25 mL). The solvent was removed via vacuum rotary evaporator. 25 mL of alcohol was added to the residue and then the precipitates were filtered, washed with minimum amount of alcohol. 0.9 g of pure 4,6,10,12-tetrakis-(4'-t-butylphenyl)-dibenzo[def, mno]chrysene. (B-163).was obtained after silica gel chromatography purification (using mixture of toluene and dichloromethane as eluants). Yield is in 56%.

TABLE 1

| Examples | Compounds | R | R' | Yield |
|---|---|---|---|---|
| 7 | B-33 | H | H | 68.2 |
| 8 | B-34 | H | t-butyl | 71.0 |
| 9 | B-35 | H | trimetylsilyl | 51.5 |
| 10 | B-162 | t-butyl | H | 67.0 |
| 11 | B-163 | t-butyl | t-butyl | 56.0 |
| 12 | B-164 | t-butyl | trimetylsilyl | 58.2 |
| 13 | B-165 | trimetylsilyl | H | 60.4 |
| 14 | B-166 | trimetylsilyl | t-butyl | 78.5 |
| 15 | B-167 | trimetylsilyl | trimetylsilyl | 61.2 |

EL Device Fabrication

Example 16

EL Device Fabrication for Undoped TBADN

An EL device satisfying the requirements of the invention was constructed in the following manner. For comparison, this example illustrates an organic EL device where the EL medium contains an invented luminescent materials layer without a dopant. The organic EL medium has three organic layers, namely, a hole transport layer, a doped luminescent layer, and an electron-transport layer between a cathode and anode.
  a) An indium-tin-oxide (ITO) coated glass substrate was sequentially ultrasonicated in a commercial detergent, rinsed in deionized water, and exposed to rf-plasma in an oxygen atmosphere for a few minutes.
  b) Onto the ITO coated glass substrate was deposited a hole transport layer of N,N'-bis-(1-naphthyl)-N,N'-diphenylbenzidine (750 Å), by evaporation from a tantalum boat.
  c) A luminescent layer of undoped TBADN (300 Å) was then deposited onto the hole-transport layer
  d) A electron-transport layer of Alq (350 Å) was then deposited onto the luminescent layer
  e) On top of the Alq layer was deposited a cathode layer (2000 Å) formed of a 10:1 atomic ratio of Mg and Ag
The above sequence completed the deposition of the EL device.

The light output from this EL device is 196 cd/m$^2$ when it was driven by a current source of 20 mA/cm$^2$ and a bias voltage of 8.54 volts. EL efficacy (cd/A) is 0.98 cd/A and the peak emission wavelength is 440 nm. The EL has a 1931 CIE color coordinates of x=0.158 and y=0.103. This EL spectrum indicates that EL emission originates from the undoped TBADN luminescent layer.

The EL results are consistent with the previous invention. The efficacy (cd/A) is slightly lower for our example as these devices do not have a hole injection layer.

Example 17

An Anthanthrecene Moiety B-39

This example illustrates the advantage of fabricating an organic EL device where the luminescent layer contains one example of the fluorescent emitting anthanthrecene moieties as the guest molecule. The organic EL medium has three organic layers, namely, a hole transport layer, a doped luminescent layer, and an electron-transport layer
  a) An indium-tin-oxide (ITO) coated glass substrate was sequentially ultrasonicated in a commercial detergent, rinsed in deionized water, and exposed to rf-plasma in an oxygen atmosphere for a few minutes.
  b) Onto the ITO coated glass substrate was deposited a hole transport layer of N,N'-bis-(1-naphthyl)-N,N'-diphenylbenzidine (750 Å), by evaporation from a tantalum boat
  c) A layer of doped TBADN (300 Å) was then deposited onto the hole-transport layer, where the guest molecule was anthanthrecene moiety B-39. Five separate devices were constructed with five different doping concentrations consisting of 0.8% (v/v), 1.1% (v/v), 2.0% (v/v) 4.2% (v/v), and 9.8% (v/v). The anthanthrecene moiety dopant B-39 was co-deposited with the TBADN to form a uniform doped luminescent layer.
  d) A electron-transport layer of Alq (300 Å) was then deposited onto the luminescent layer
  e) On top of the Alq layer was deposited a cathode layer (2000 Å) formed of a 10:1 atomic ratio of Mg and Ag
The above sequence completed the deposition of the EL device.

FIG. 11 illustrates the spectral results for the doped luminescent layer as a function of concentration. All spectral data were measured at a drive current of 20 mA/cm$^2$. The undoped spectrum is included for comparison. FIG. 12 illustrated the current density—voltage relation as a function of three doping concentration. The data from FIGS. 11 and 12 are summarized in Table 2

TABLE 2

Summarizes the EL results as a function of doping concentration % (v/v) of the devices illustrated in FIG. 2 for two drive current densities.

| J = 20 mA/cm$^2$ | | | | | | |
|---|---|---|---|---|---|---|
| B-39 percent | V | x | y | cd/A | peak (nm) | L(@peak) |
| 0% | 8.54 | 0.158 | 0.103 | 0.983 | 440 | 2.68E-02 |
| 0.65% | 10.10 | 0.152 | 0.11 | 0.93 | 452 | 3.00E-02 |
| 1.02% | 9.83 | 0.156 | 0.122 | 0.907 | 452 | 3.13E-02 |
| 3.22% | 8.97 | 0.147 | 0.256 | 2.13 | 452 | 2.81E-02 |

| J = 2 mA/cm$^2$ | | | | |
|---|---|---|---|---|
| B-39 percent | V | x | y | cd/A |
| 0% | 5.56 | 0.156 | 0.098 | 1.11 |
| 0.65% | 6.52 | 0.152 | 0.11 | 0.93 |
| 1.02% | 6.35 | 0.156 | 0.122 | 0.974 |
| 3.22% | 6.38 | 0.157 | 0.151 | 1.13 |

The results of Example 17 illustrate the value of the B-39 emitting dopant for EL applications. The efficacy and color are maximum at a doping concentration of approximately 2%. The efficacy of the emitting layer consisting of TBADN doped with B-163 is greater than the device with undoped TBADN emitting layer. Further, the B-163 dopant improves the color CIE coordinates as evidenced by the spectra for the device with a doped emitting layer having a more narrow full width at half maximum as compared to the undoped device. The CIE coordinates for B-39 are more pure blue as compared to B-163 and undoped TBADN. This blue emission is desired for display applications. These qualities demonstrated the advantages of the emitting dopant.

Example 18

One of the Anthanthrecene Moieties B-163

This example illustrates the advantage of fabricating an organic EL device where the luminescent layer contains one example of the fluorescent emitting anthanthrecene moiety as the guest molecule. The organic EL medium has three organic layers, namely, a hole transport layer, a doped luminescent layer, and an electron-transport layer
  a) An indium-tin-oxide (ITO) coated glass substrate was sequentially ultrasonicated in a commercial detergent, rinsed in deionized water, degreased in toluene vapor and exposed to rf-plasma in an oxygen atmosphere for a few minutes.
  b) Onto the ITO coated glass substrate was deposited a hole transport layer of N,N'-bis-(1-naphthyl)-N,N'-diphenylbenzidine (750 Å), by evaporation from a tantalum boat
  c) A layer of doped TBADN (300 Å) was then deposited onto the hole-transport layer, where the guest molecule was the anthanthrecene moiety. Five separate devices were constructed with five different doping concentrations consisting of 0.8% (v/v), 1.1% (v/v), 2.0% (v/v) 4.2% (v/v), and 9.8% (v/v). The anthanthrecene moiety dopant was co-deposited with the TBADN to form a uniform doped luminescent layer
  d) A electron-transport layer of Alq (300 Å) was then deposited onto the luminescent layer
  e) On top of the Alq layer was deposited a cathode layer (2000 Å) formed of a 10:1 atomic ratio of Mg and Ag The above sequence completed the deposition of the EL device.

FIG. 13 illustrates the spectral results for the doped luminescent layer as a function of concentration. All spectral data were measured at a drive current of 20 mA/cm². The undoped spectrum is included for comparison. FIG. 14 illustrated the current density—voltage relation as a function of doping concentration. Table 3 summarizes the results from FIGS. 13 and 14.

Table 3 summarizes the EL results of the devices illustrated in FIG. 2 and 3 for two drive current densities.

| B-163 percent | V | x | y | cd/A | peak (nm) | L(@peak) |
|---|---|---|---|---|---|---|
| | | $J = 20$ mA/cm$^2$ | | | | |
| 0% | 8.54 | 0.158 | 0.103 | 0.983 | 440 | 2.68E−02 |
| 0.80% | 8.69 | 0.149 | 0.207 | 1.83 | 468 | 3.40E−02 |
| 1.10% | 8.38 | 0.147 | 0.225 | 2.29 | 472 | 3.77E−02 |
| 2.00% | 9.11 | 0.144 | 0.221 | 1.68 | 472 | 3.24E−02 |
| 4.20% | 9.92 | 0.146 | 2.61 | 1.69 | 472 | 3.10E−02 |
| 9.80% | 9.52 | 0.145 | 2.84 | 1.87 | 476 | 3.51E−02 |

| B-163 Percent | V | x' | y' | cd/A |
|---|---|---|---|---|
| | | $J = 2$ mA/cm$^2$ | | |
| 0% | 5.56 | 0.156 | 0.098 | 1.11 |
| 0.80% | 5.6 | 0.146 | 0.209 | 2.12 |
| 1.10% | 5.43 | 0.145 | 0.229 | 2.29 |
| 2.00% | 5.92 | 0.143 | 0.228 | 1.63 |
| 4.20% | 6.38 | 0.144 | 0.263 | 1.75 |
| 9.80% | 6.16 | 0.144 | 0.288 | 1.99 |

The results of Example 18 illustrate the value of the B-163 emitting dopant for EL applications. The efficacy and color are maximum at a doping concentration of approximately 2%. The efficacy of the emitting layer consisting of TBADN doped with B-163 is more than twice as high as the device with undoped TBADN emitting layer. Further, the B-163 dopant improves the color CIE coordinates as evidenced by the spectra for the device with a doped emitting layer having a more narrow full width at half maximum as compared to the undoped device. These qualities demonstrate the advantages of the emitting dopant.

Example 19

In the second example, an organic EL device was fabricated where the luminescent layer contains one example of the fluorescent emitting anthanthrecene moiety as the guest molecule diluted into a TBADN host matrix. A second device consisting of undoped TBADN emitting layer at the same thickness. A third device fabricated with 1000 (Å) thick B-163 emitting layer. The current density—voltage characteristics where measured for the three devices. The devices were fabricated as follows:
  a) An indium-tin-oxide (ITO) coated glass substrate was sequentially ultrasonicated in a commercial detergent, rinsed in deionized water, degreased in toluene vapor and exposed to rf-plasma in an oxygen atmosphere for a few minutes.
  b) Onto the ITO coated glass substrate was deposited a hole transport layer of N,N'-bis-(1-naphthyl)-N,N'-diphenylbenzidine (750 Å), by evaporation from a tantalum boat
  c) A layer of doped TBADN (300 Å) was then deposited onto the hole-transport layer, where the guest molecule was the anthanthrecene moiety. Five separate devices were constructed with a doping concentration consisting of 1.1% (v/v). The anthanthrecene moiety dopant was co-deposited with the TBADN to form a uniform doped luminescent layer. A device with an undoped TBADN layer was also fabricated. A third device with a 1000 (Å) emitting layer composed of B-163.
  d) A electron-transport layer of Alq (300 Å) was then deposited onto the luminescent layer
  e) On top of the Alq layer was deposited a cathode layer (2000 Å) formed of a 10:1 atomic ratio of Mg and Ag FIG. 15 illustrates the current density—voltage relation for undoped TBADN layer, TBADN doped with 1.1% (v/v)

B-163 and 1000 (Å) thick B-163 with no doping. Example 19 illustrates the importance of the anthanthrecene moiety for carrier transport applications. In FIG. 15, the drive voltage for the device with 100% B-163 in the emitting layer is almost twice as low as compared to an emitting layer consisting of undoped and doped TBADN. This results is important for EL operation to improve the overall power efficiency in Lm/(electrical power Watts).

What is claimed is:

1. An organic EL device, comprising an anode and a cathode, and at least one organic luminescent layer doped with a non-aggregate luminescent compound of the formula:

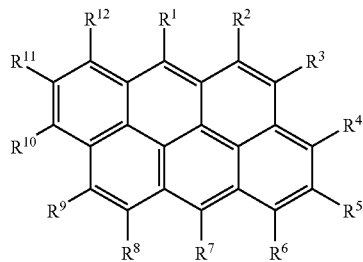

positioned between said anode and said cathode, and wherein:

$R^1$, $R^2$, $R^3$, $R^4$, $R^5$, $R^6$, $R^7$, $R^8$, $R^9$, $R^{10}$, $R^{11}$ and $R^{12}$ are individual substituents, each substituent is an individual group selected from the group consisting of hydrogen, halogens, and groups that contain 1 to 48 carbon atoms, and at least one group is not hydrogen, further, $R^1$, $R^2$, $R^3$, $R^4$, $R^5$, $R^6$, $R^7$, $R^8$, $R^9$, $R^{10}$, $R^{11}$ and $R^{12}$ is not an arylamino group.

2. The EL device according to claim 1, comprising said compound wherein $R^1$, $R^2$, $R^3$, $R^4$, $R^5$, $R^6$, $R^7$, $R^8$, $R^9$, $R^{10}$, $R^{11}$ and $R^{12}$ is the individual group consisting of hydrogen, or alkyl of from 1 to 48 carbon atoms, and $R_2$ and $R_3$, $R_5$ and $R_6$, $R_8$ and $R_9$, $R_{11}$ and $R_{12}$ can connect to form a 5 or 6 member ring system.

3. The EL device according to claim 1, comprising said compound wherein $R^1$, $R^2$, $R^3$, $R^4$, $R^5$, $R^6$, $R^7$, $R^8$, $R^9$, $R^{10}$, $R^{11}$ and $R^{12}$ is the individual group consisting of aryl or substituted aryl of from 5 to 48 carbon atoms, or 4 to 48 carbon atoms necessary to complete a fused aromatic ring of naphthenyl, anthracenyl, pyrenyl, or perylenyl.

4. The EL device according to claim 1, comrising said compound wherein $R^1$, $R^2$, $R^3$, $R^4$, $R^5$, $R^6$, $R^7$, $R^8$, $R^9$, $R^{10}$, $R^{11}$ and $R^{12}$ is the individual group consisting of heteroaryl or substituted heteroaryl of from 5 to 24 carbon atoms, or 4 to 48 carbon atoms necessary to complete a fused heteroaromatic ring of furyl, thienyl, pyridyl, quinolinyl or heterocyclic system.

5. The EL device according to claim 1, comprising said compound wherein $R^1$, $R^2$, $R^3$, $R^4$, $R^5$, $R^6$, $R^7$, $R^8$, $R^9$, $R^{10}$, $R^{11}$ and $R^{12}$ is the individual group consisting of alkoxyl, amino, alkyl amino, dialkyl amino, or diaryl amino of from 1 to 24 carbon atoms.

6. The EL device according to claim 1, comprising said compound wherein $R^1$, $R^2$, $R^3$, $R^4$, $R^5$, $R^6$, $R^7$, $R^{8, R9}$, $R^{10}$, $R^{11}$ and $R^{12}$ is the individual group consisting of F, Cl, Br, I, CN, NCS, NCO, $B(OH)_2$, $B(OCH_2CH_2O)$, $B[OC(CH_3)_2 C(CH_3)_2O]$, $SO_2$ $R^{13}$, $SO_3$ $R^{14}$, $SO_2NR_2$, $SiR_3$, $SiHR_2$, $SiR_2OH$, where R, $R^{13}$ and $R^{14}$ is hydrogen, chlorine, bromine, alkyl group containing 1–12 carbon atoms, or aryl.

7. The EL device according to claim 1, comprising said compound wherein $R^1$, $R^2$, $R^3$, $R^4$, $R^5$, $R^6$, $R^7$, $R^8$, $R^9$, $R^{10}$, $R^{11}$ and $R^{12}$ is the individual group consisting of a group of formula $-L(CH_2)R^{15}$ where n is 0 to 12, $R^{15}$ is a hydrogen, hydroxy, amino, alkylamino, dialkylamino, $—COR^{16}$ or $—COOR^{17}$ where $R^{16}$ is a hydrogen, chlorine, COCl, alkyl group containing 1–12 carbon atoms, $—NR2$, $—NHR$ or aryl and $R^{17}$ is a hydrogen, alkyl group containing 1–12 carbon atoms, aryl, COR, 2,4-dinitrophenyl, N-imido or $—NR_2$ and L is a direct bond or C=O.

8. The EL device according the claim 1, wherein said compound is:

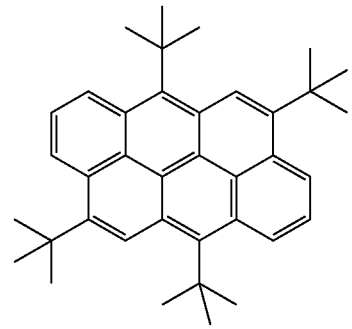

9. The EL device according the claim 1, wherein said compound is:

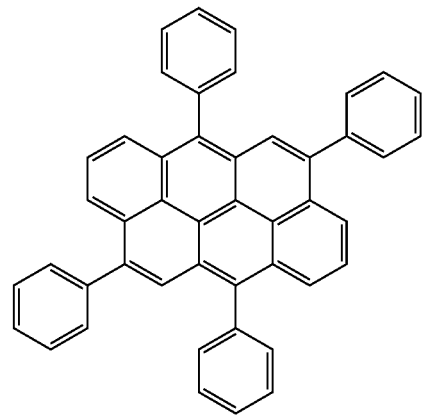

10. The EL device according the claim 1, wherein said compound is:
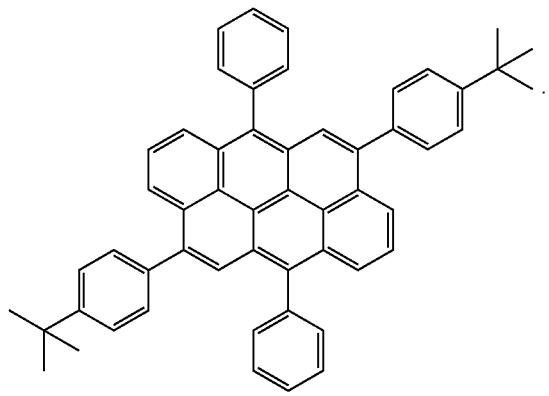
11. The EL device according the claim 1, wherein said compound is:
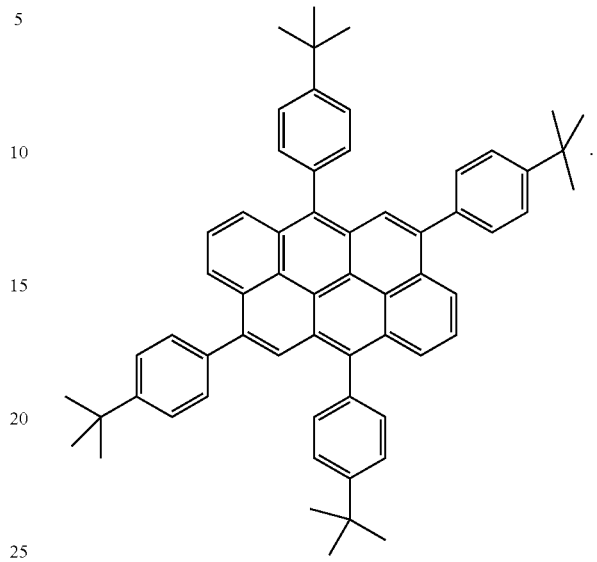
* * * * *